(12) United States Patent
Lin et al.

(10) Patent No.: US 10,306,777 B2
(45) Date of Patent: May 28, 2019

(54) WIRING BOARD WITH DUAL STIFFENERS AND DUAL ROUTING CIRCUITRIES INTEGRATED TOGETHER AND METHOD OF MAKING THE SAME

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 96 days.

(21) Appl. No.: 15/247,828

(22) Filed: Aug. 25, 2016

(65) Prior Publication Data
US 2016/0366762 A1    Dec. 15, 2016

Related U.S. Application Data

(63) Continuation-in-part of application No. 14/746,792, filed on Jun. 22, 2015, now abandoned.
(Continued)

(51) Int. Cl.
*H05K 3/32* (2006.01)
*H05K 3/46* (2006.01)
(Continued)

(52) U.S. Cl.
CPC ......... *H05K 3/4682* (2013.01); *H01L 21/486* (2013.01); *H01L 23/36* (2013.01);
(Continued)

(58) Field of Classification Search
CPC ......... Y10T 29/49165; Y10T 29/49155; Y10T 29/4913; Y10T 29/49128; H05K 1/115;
(Continued)

(56) References Cited

U.S. PATENT DOCUMENTS 6,909,054 B2 *   6/2005   Sakamoto ........... H01L 21/4846
                                                  174/260
6,952,049 B1 *   10/2005  Ogawa ................... H01G 4/232
                                                  257/678

(Continued)

*Primary Examiner* — A. Dexter Tugbang
*Assistant Examiner* — Kaying Kue
(74) *Attorney, Agent, or Firm* — Pai Patent & Trademark Law Firm; Chao-Chang David Pai

(57) ABSTRACT

A wiring board with dual stiffeners and integrated dual routing circuitries is characterized in that first and second routing circuitries are positioned within and beyond a through opening of a first stiffener, respectively, and an array of vertical connecting channels are disposed on the second routing circuitry and laterally surrounded by a second stiffener. The mechanical robustness of the first and second stiffeners can prevent the wiring board from warping. The vertical connecting channels can offer electrical contacts for next-level connection. The first routing circuitry, positioned within the through opening of the first stiffener, can provide primary fan-out routing, whereas the second routing circuitry not only provides further fan-out wiring structure for the first routing circuitry, but also mechanically binds the first routing circuitry with the first stiffener.

6 Claims, 24 Drawing Sheets

Related U.S. Application Data

(60) Provisional application No. 62/092,196, filed on Dec. 15, 2014, provisional application No. 62/121,450, filed on Feb. 26, 2015.

(51) Int. Cl.

| | | |
|---|---|---|
| *H01L 25/065* | (2006.01) | |
| *H05K 1/18* | (2006.01) | |
| *H01L 23/36* | (2006.01) | |
| *H01L 21/48* | (2006.01) | |
| *H01L 23/538* | (2006.01) | |
| *H01L 23/498* | (2006.01) | |
| *H01L 23/00* | (2006.01) | |
| *H01L 23/31* | (2006.01) | |

(52) U.S. Cl.
CPC ....... *H01L 23/5383* (2013.01); *H01L 23/5384* (2013.01); *H01L 23/5389* (2013.01); *H01L 25/065* (2013.01); *H05K 1/181* (2013.01); *H05K 3/4694* (2013.01); *H01L 23/3128* (2013.01); *H01L 23/49816* (2013.01); *H01L 23/562* (2013.01); *H01L 24/16* (2013.01); *H01L 24/32* (2013.01); *H01L 24/73* (2013.01); *H01L 2224/16145* (2013.01); *H01L 2224/16225* (2013.01); *H01L 2224/32225* (2013.01); *H01L 2224/73204* (2013.01); *H01L 2924/00014* (2013.01); *H01L 2924/15311* (2013.01); *H01L 2924/15321* (2013.01); *H01L 2924/181* (2013.01); *H01L 2924/3511* (2013.01); *H05K 1/183* (2013.01); *H05K 1/185* (2013.01); *Y02P 70/611* (2015.11)

(58) Field of Classification Search
CPC ........ H05K 1/185; H05K 1/11; H05K 3/4682; H05K 3/32; H05K 3/4697; H05K 2201/09036; H05K 2201/091; H05K 1/181; H05K 3/4694; Y02P 70/611
See application file for complete search history.

(56) References Cited

U.S. PATENT DOCUMENTS

| | | | |
|---|---|---|---|
| 7,851,269 B2 | 12/2010 | Muthukumar et al. | |
| 7,902,660 B1 | 3/2011 | Lee et al. | |
| 7,981,728 B2 | 7/2011 | Cho | |
| 8,227,703 B2 | 7/2012 | Maruyama et al. | |
| 8,901,724 B2* | 12/2014 | Guzek | H01L 24/19 257/686 |
| 9,165,793 B1* | 10/2015 | Wang | H01L 21/56 |
| 9,312,219 B2* | 4/2016 | Hu | H01L 23/49827 |
| 9,324,626 B2* | 4/2016 | Shen | H01L 23/315 |
| 9,374,896 B2* | 6/2016 | Chen | H05K 1/113 |
| 2003/0015342 A1* | 1/2003 | Sakamoto | H01L 21/4846 174/250 |
| 2006/0272853 A1* | 12/2006 | Muramatsu | H05K 1/0231 174/262 |
| 2008/0116569 A1* | 5/2008 | Huang | H01L 23/36 257/712 |
| 2009/0145636 A1* | 6/2009 | Miki | H01L 21/6835 174/255 |
| 2010/0025081 A1* | 2/2010 | Arai | H01L 21/4857 174/251 |
| 2011/0063806 A1* | 3/2011 | Kariya | H01L 21/4857 361/748 |
| 2011/0156231 A1* | 6/2011 | Guzek | H01L 25/16 257/686 |
| 2011/0254124 A1* | 10/2011 | Nalla | H01L 23/552 257/531 |
| 2012/0009738 A1* | 1/2012 | Crawford | H01L 21/6835 438/121 |
| 2012/0234589 A1* | 9/2012 | Furuichi | H05K 3/4682 174/261 |
| 2013/0271929 A1 | 10/2013 | Malatkar et al. | |
| 2014/0182911 A1* | 7/2014 | Lee | H05K 1/185 174/260 |
| 2015/0084206 A1 | 3/2015 | Lin | |

\* cited by examiner

WIRING BOARD WITH DUAL STIFFENERS AND DUAL ROUTING CIRCUITRIES INTEGRATED TOGETHER AND METHOD OF MAKING THE SAME

CROSS REFERENCE TO RELATED APPLICATIONS

This application is a continuation-in-part of U.S. application Ser. No. 14/746,792 filed Jun. 22, 2015, which claims the priority benefit of U.S. Provisional Application Ser. No. 62/092,196 filed Dec. 15, 2014 and the priority benefit of U.S. Provisional Application Ser. No. 62/121,450 filed Feb. 26, 2015. The entirety of each of said applications is incorporated herein by reference.

FIELD OF THE INVENTION

The present invention relates to a wiring board and, more particularly, to a wiring board having dual stiffeners and dual routing circuitries integrated together, and a method of making the same.

DESCRIPTION OF RELATED ART

Market trends of electronic devices such as multimedia devices demand for faster and slimmer designs. One of the approaches is to interconnect semiconductor chip through a coreless substrate so that the assembled device can be thinner and signal integrity can be improved. U.S. Pat. Nos. 7,851,269, 7,902,660, 7,981,728, and 8,227,703 disclose various coreless substrates for such kind of purpose. However, although the inductance of these wiring boards can be reduced, other features such as design flexibility are not addressed as they do not have adequate fan-out routing capability to meet stringent requirements for ultra-fine flip chip assembly.

For the reasons stated above, and for other reasons stated below, an urgent need exists to develop a new wiring board that can address routing requirement and ensure low warping during assembly and operation.

SUMMARY OF THE INVENTION

A primary objective of the present invention is to provide a wiring board having first and second routing circuitries integrated together so as to enable high routing flexibility and achieve superior signal integrity. For instance, the first routing circuitry can be configured as primary fan-out circuitry with very high routing density, whereas the second routing circuitry can be configured as further fan-out circuitry with much coarse line/space. The two routing circuitries integrated together can offer the shortest possible interconnection length for the wiring board, thereby reducing the inductance and improving the electrical performance of the assembly.

Another objective of the present invention is to provide a wiring board in which first and second stiffeners are used to provide mechanical support from both opposite sides of the integrated dual routing circuitries and vertical connecting channels are sealed in the second stiffener, so that warping and bending of the wiring board can be suppressed for improved mechanical reliability and the vertical connecting channels can offer electrical contacts for next-level routing circuitry connection or board assembling.

Yet another objective of the present invention is to provide a wiring board having the first routing circuitry positioned within a through opening of the first stiffener and the second routing circuitry positioned beyond the through opening of the first stiffener, thereby improving the production yield of the wiring board.

In accordance with the foregoing and other objectives, the present invention provides a wiring board that includes a first stiffener, a first routing circuitry, a second routing circuitry, a second stiffener and an array of vertical connecting channels. In a preferred embodiment, the first stiffener and the second stiffener, positioned at both opposite sides of the integrated dual routing circuitries, provides high modulus anti-warping platforms for the wiring board; the first routing circuitry, positioned within a through opening of the first stiffener, provides primary fan-out routing for a semiconductor device to be assembled thereon so that the pad size and pitch of the semiconductor device can be enlarged before proceeding to the subsequent formation of the second routing circuitry; the second routing circuitry, laterally extending over the first stiffener and electrically connected to the first routing circuitry, mechanically binds the first routing circuitry with the first stiffener and provides secondary fan-out routing for the semiconductor device and has pad pitch and size larger than those of the first routing circuitry; and the vertical connecting channels, sealed in the second stiffener and positioned at the peripheral area of the second routing circuitry, are electrically connected to the second routing circuitry and offers electrical contacts for the next level assembly.

In another aspect, the present invention provides a wiring board, comprising: a first stiffener having a through opening, wherein the through opening has an interior sidewall surface that extends through the first stiffener; a first routing circuitry having a first surface and an opposite second surface and positioned within the through opening and adjacent to the interior sidewall surface of the first stiffener; a second routing circuitry disposed over the second surface of the first routing circuitry and laterally extending over a surface of the first stiffener, wherein the second routing circuitry is electrically coupled to the first routing circuitry through metallized vias and has a third surface facing away from the second surface; a second stiffener that is disposed over the third surface of the second routing circuitry; and an array of vertical connecting channels laterally surrounded by the second stiffener, wherein the vertical connecting channels are electrically connected to the second routing circuitry and exposed from an exterior surface of the second stiffener.

In yet another aspect, the present invention provides a method of making, comprising steps of: forming a first routing circuitry on a detachable sacrificial carrier, wherein the first routing circuitry has a first surface adjacent to the sacrificial carrier and an opposite second surface; providing a first stiffener that has a through opening, wherein the through opening has an interior sidewall surface that extends through the first stiffener; inserting the first routing circuitry and the sacrificial carrier into the through opening of the first stiffener, with the first routing circuitry and the sacrificial carrier being adjacent to the interior sidewall surface of the first stiffener; forming a second routing circuitry over the second surface of the first routing circuitry and a surface of the first stiffener, wherein the second routing circuitry is electrically coupled to the first routing circuitry through metallized vias and has a third surface facing away from the second surface; forming an array of vertical connecting channels over the third surface of the second routing circuitry, wherein the vertical connecting channels are electrically coupled to the second routing circuitry; forming a second stiffener over the third surface of the second routing circuitry; and removing the sacrificial carrier to expose the first surface of the first routing circuitry; wherein the vertical connecting channels are laterally surrounded by the second stiffener and exposed from an exterior surface of the second stiffener.

Unless specifically indicated or using the term "then" between steps, or steps necessarily occurring in a certain order, the sequence of the above-mentioned steps is not limited to that set forth above and may be changed or reordered according to desired design.

The method of making a wiring board according to the present invention has numerous advantages. For instance, inserting the sacrificial carrier and the first routing circuitry into the through opening of the first stiffener before the formation of the routing circuitry is particularly advantageous as the sacrificial carrier together with the first stiffener provides a stable platform for forming the second routing circuitry and micro-via connection failure in the subsequent formation of the second routing circuitry can be avoided. Forming the second stiffener on the second routing circuitry can ensure the optimum rigidity of the wiring board, so that the warping after removal of the sacrificial carrier can be suppressed by the mechanical robustness of the dual stiffeners at two opposite sides of the integrated dual routing circuitries. Additionally, the two-stage formation of the interconnect substrate can avoid serious warping problem when multiple layers of routing circuitries are needed.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENTS

Hereafter, examples will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-18 are schematic views showing a method of making a wiring board that includes a first stiffener, a first routing circuitry, a second routing circuitry, an array of vertical connecting channels and a second stiffener in accordance with the first embodiment of the present invention.

Figure 1:
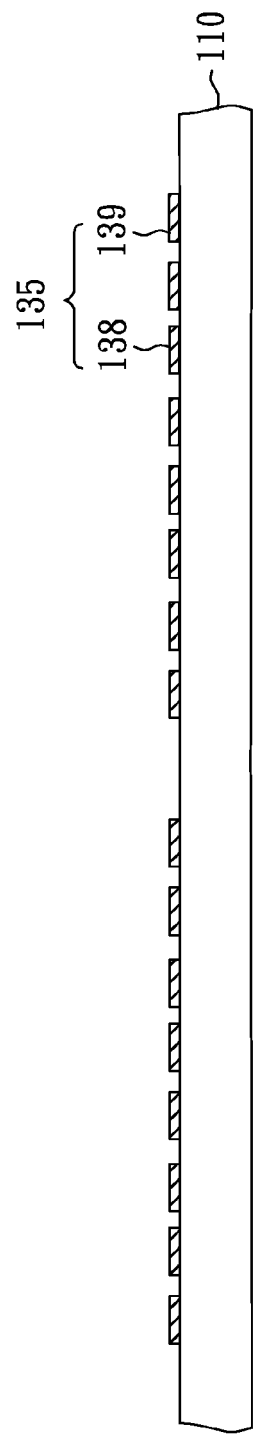
FIGS. 1 and 2 are cross-sectional and top perspective views, respectively, showing a structure with routing traces formed on a sacrificial carrier in accordance with the first embodiment of the present invention.
Figure 2:
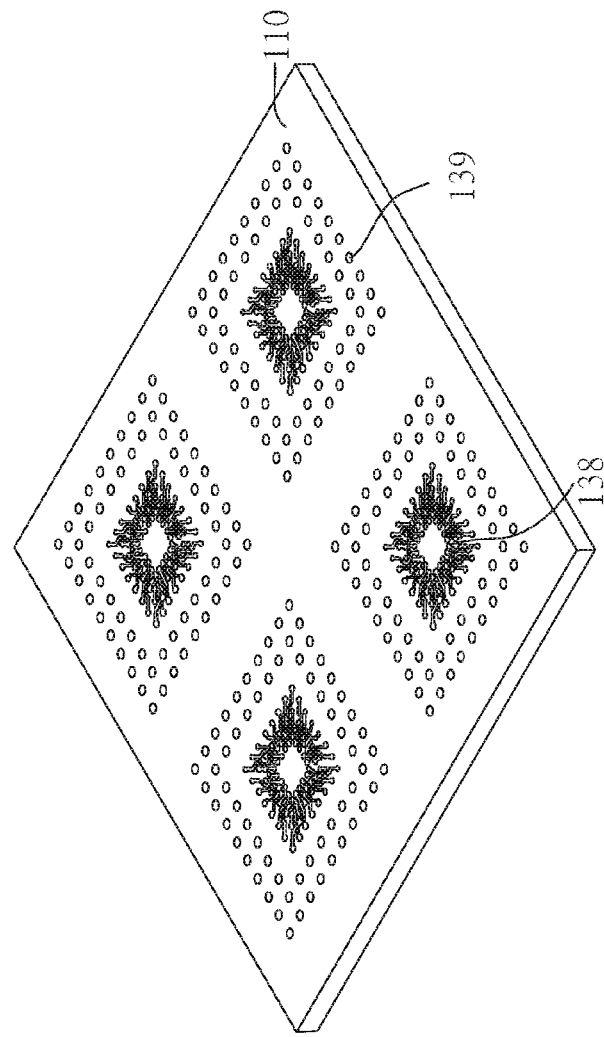

FIGS. 1 and 2 are cross-sectional and top perspective views, respectively, of the structure with routing traces 135 formed on a sacrificial carrier 110 by metal deposition and metal patterning process. In this illustration, the sacrificial carrier 110 is a single-layer structure, and the routing traces 135 include bond pads 138 and stacking pads 139. The sacrificial carrier 110 typically is made of copper, aluminum, iron, nickel, tin, stainless steel, silicon, or other metals or alloys, but any other conductive or non-conductive material also may be used. The thickness of the sacrificial carrier 110 preferably ranges from 0.1 to 2.0 mm. In this embodiment, the sacrificial carrier 110 is made of an iron-based material and has a thickness of 1.0 mm. The routing traces 135 typically are made of copper and can be pattern deposited by numerous techniques, such as electroplating, electroless plating, evaporating, sputtering or their combinations, or be thin-film deposited followed by a metal patterning process. For a conductive sacrificial carrier 110, the routing traces 135 are deposited typically by plating of metal. The metal patterning techniques include wet etching, electro-chemical etching, laser-assist etching, and their combinations with an etch mask (not shown) thereon that defines the routing traces 135.

Figure 3:
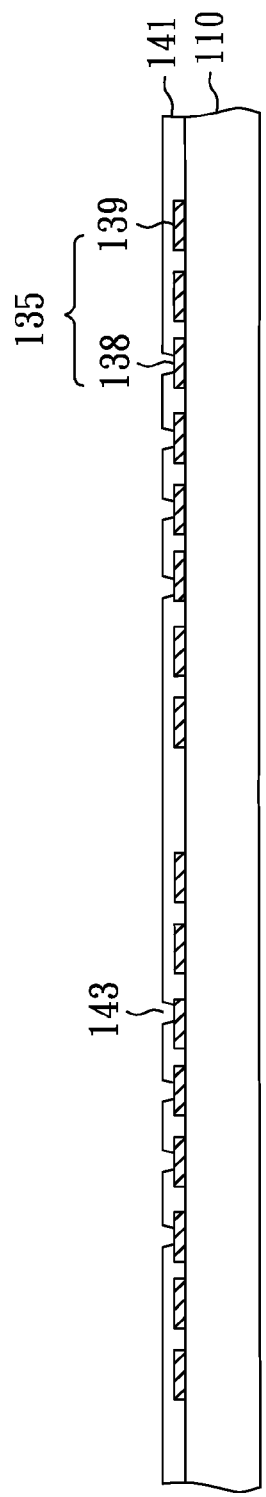
FIG. 3 is a cross-sectional view showing that the structure of FIG. 1 is provided with a first dielectric layer and first via openings in accordance with the first embodiment of the present invention.

FIG. 3 is a cross-sectional view of the structure with a first dielectric layer 141 on the sacrificial carrier 110 as well as the routing traces 135 and first via openings 143 in the first dielectric layer 141. The first dielectric layer 141 is deposited typically by lamination or coating, and contacts and covers and extends laterally on the sacrificial carrier 110 and the routing traces 135 from above. The first dielectric layer 141 typically has a thickness of 50 microns, and can be made of epoxy resin, glass-epoxy, polyimide, or the like. After the deposition of the first dielectric layer 141, the first via openings 143 are formed by numerous techniques including laser drilling, plasma etching and photolithography, and typically have a diameter of 50 microns. Laser drilling can be enhanced by a pulsed laser. Alternatively, a scanning laser beam with a metal mask can be used. The first via openings 143 extend through the first dielectric layer 141 and are aligned with selected portions of the routing traces 135.

Figure 4:
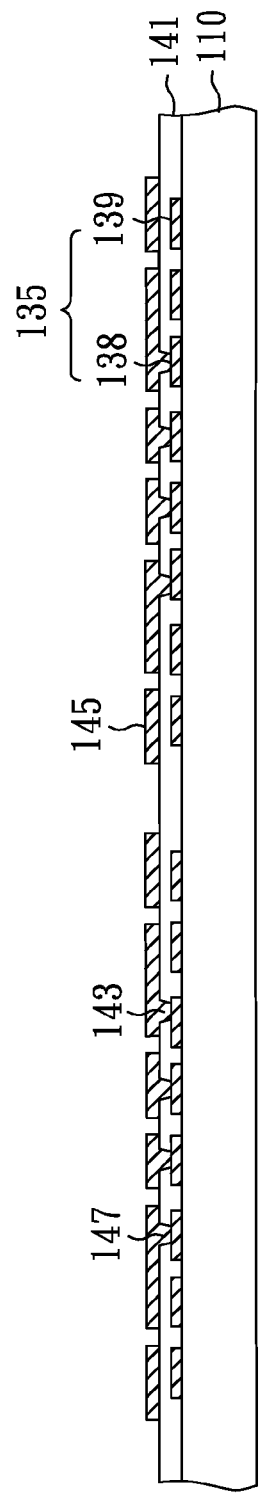
FIG. 4 is a cross-sectional view showing that the structure of FIG. 3 is provided with first conductive traces in accordance with the first embodiment of the present invention.

Referring now to FIG. 4, first conductive traces 145 are formed on the first dielectric layer 141 by metal deposition and metal patterning process. The first conductive traces 145 extend from the routing traces 135 in the upward direction, fill up the first via openings 143 to form first metallized vias 147 in direct contact with the routing traces 135, and extend laterally on the first dielectric layer 141. As a result, the first conductive traces 145 can provide horizontal signal routing in both the X and Y directions and vertical routing through the first via openings 143 and serve as electrical connections for the routing traces 135.

The first conductive traces 145 can be deposited as a single layer or multiple layers by any of numerous techniques, such as electroplating, electroless plating, evaporating, sputtering, or their combinations. For instance, they can be deposited by first dipping the structure in an activator solution to render the first dielectric layer 141 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the first conductive traces 145 by any of numerous techniques including wet etching, electro-chemical etching, laser-assist etching, and their combinations, with an etch mask (not shown) thereon that defines the first conductive traces 145.

Figure 5:
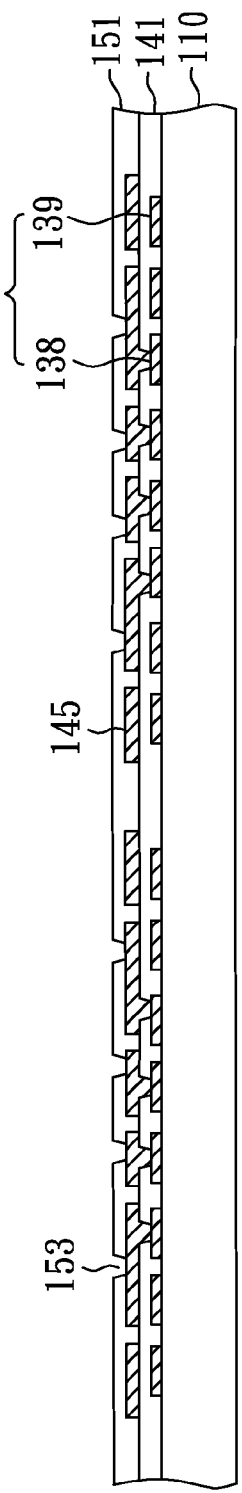
FIG. 5 is a cross-sectional view showing that the structure of FIG. 4 is provided with a second dielectric layer and second via openings in accordance with the first embodiment of the present invention.

FIG. 5 is a cross-sectional view of the structure with a second dielectric layer 151 on the first dielectric layer 141 as well as the first conductive traces 145 and second via openings 153 in the second dielectric layer 151. The second dielectric layer 151 is deposited typically by lamination or coating, and contacts and covers and extends laterally on the first dielectric layer 141 and the first conductive traces 145 from above. The second dielectric layer 151 typically has a thickness of 50 microns, and can be made of epoxy resin, glass-epoxy, polyimide, or the like. After the deposition of the second dielectric layer 151, the second via openings 153 are formed and extend through the second dielectric layer 151 to expose selected portions of the first conductive traces 145. Like the first via openings 143, the second via openings 153 can be formed by any of numerous techniques including laser drilling, plasma etching and photolithography and typically have a diameter of 50 microns.

Figure 6:
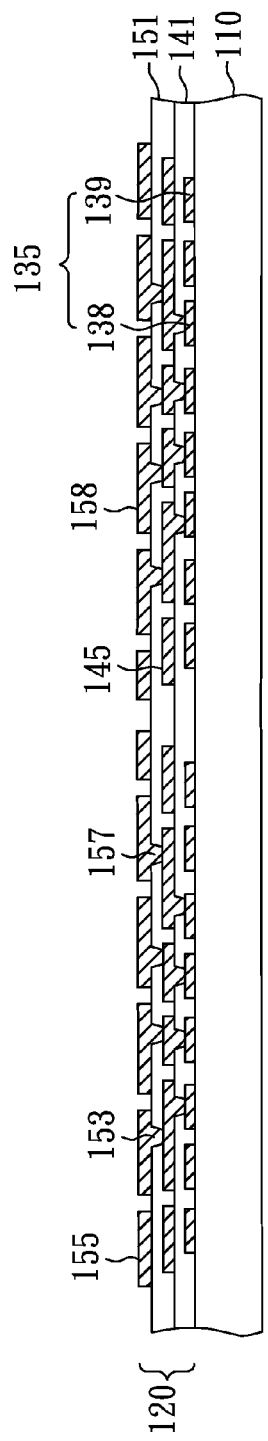
FIGS. 6 and 7 are cross-sectional and top perspective views, respectively, showing that the structure of FIG. 5 is provided with second conductive traces in accordance with the first embodiment of the present invention.
Figure 7:
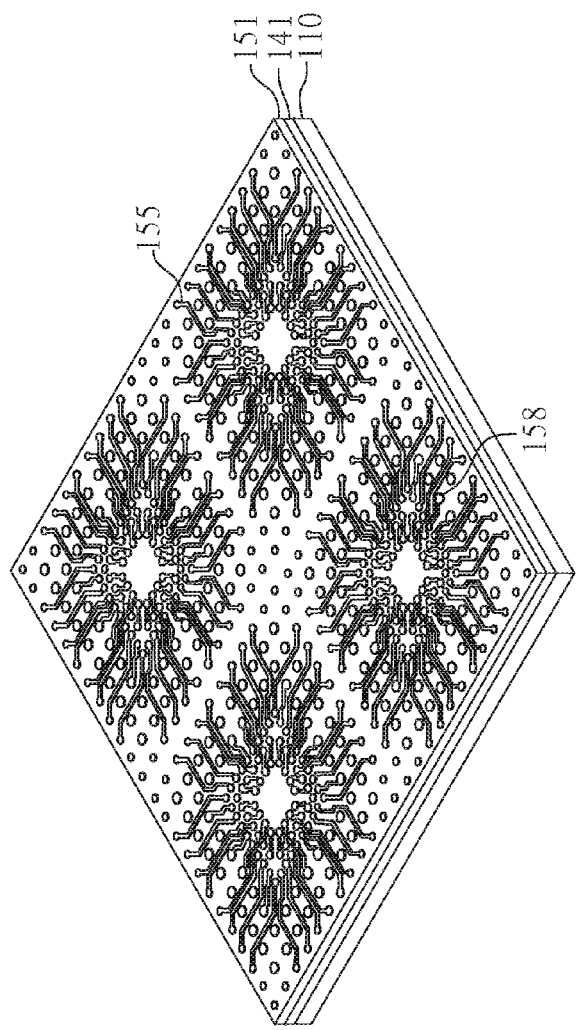

FIGS. 6 and 7 are cross-sectional and top perspective views, respectively, of the structure provided with second conductive traces 155 on the second dielectric layer 151 by metal deposition and metal patterning process. The second conductive traces 155 extend from the first conductive traces 145 in the upward direction, fill up the second via openings 153 to form second metallized vias 157 in direct contact with the first conductive traces 145, and extend laterally on the second dielectric layer 151. As shown in FIG. 7, the second conductive traces 155 include a patterned array of contact pads 158 that have a pitch larger than that of the bond pads 138.

At this stage, the formation of a first routing circuitry 120 on the sacrificial carrier 110 is accomplished. In this illustration, the first routing circuitry 120 includes routing traces 135, a first dielectric layer 141, first conductive traces 145, a second dielectric layer 151 and the second conductive traces 155.

Figure 8:
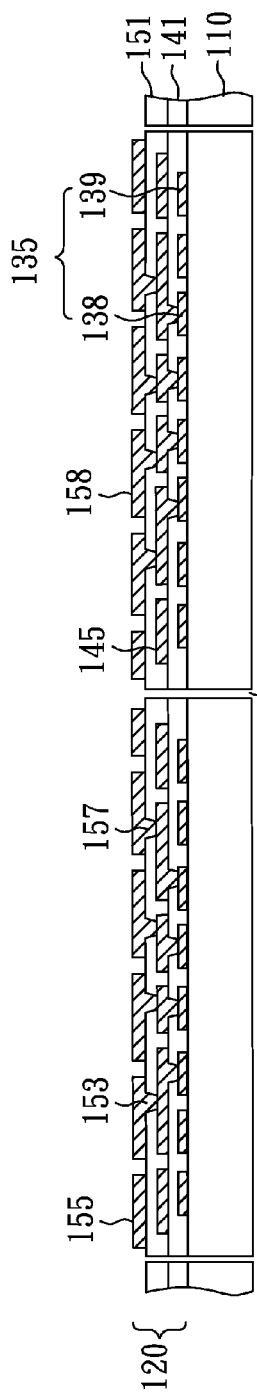
FIGS. 8 and 9 are cross-sectional and top perspective views, respectively, of a diced state of the panel-scale structure of FIGS. 6 and 7 in accordance with the first embodiment of the present invention.
Figure 9:
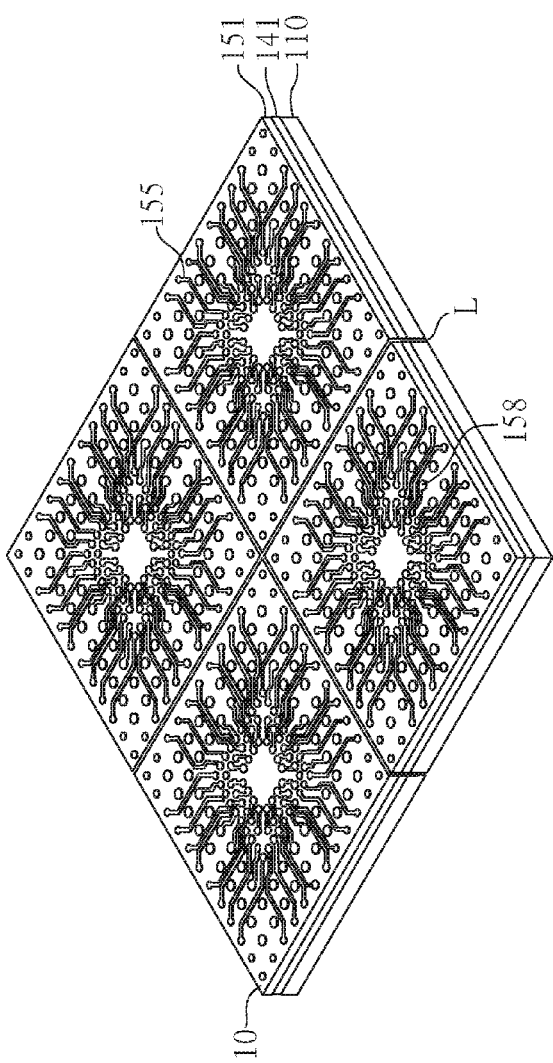

FIGS. 8 and 9 are cross-sectional and top perspective views, respectively, of the panel-scale structure of FIGS. 6 and 7 diced into individual pieces. The panel-scale structure, having the first routing circuitry 120 on the sacrificial carrier 110, is singulated into individual subcomponent 10 along dicing lines "L".

Figure 10:
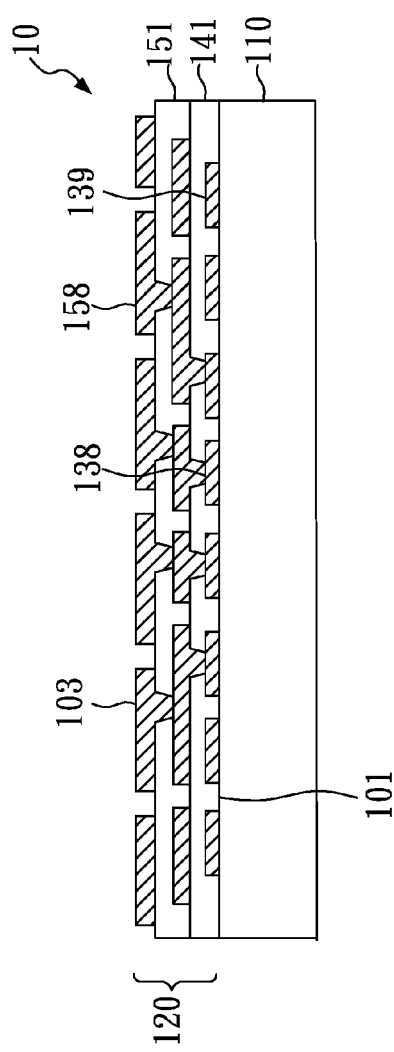
FIG. 10 is a cross-sectional view of a subcomponent corresponding to a diced unit in FIGS. 8 and 9 in accordance with the first embodiment of the present invention.

FIG. 10 is a cross-sectional view of an individual subcomponent 10 that includes a sacrificial carrier 110 and a first routing circuitry 120. In this illustration, the first routing circuitry 120 is a buildup routing circuitry, and has a first surface 101 adjacent to the sacrificial carrier 110, a second surface 103 opposite to the first surface 101, bond pads 138 and stacking pads 139 at the first surface 101, and contact pads 158 at the second surface 103. The bond pads 138 is to match chip I/O pads, whereas the contact pads 158 on the outmost conductive traces away from the sacrificial carrier 110 have a pitch larger than that of the bond pads 138.

Accordingly, the first routing circuitry 120 has a pattern of traces that fan out from a finer pitch at bonds pads 138 to a coarser pitch at contact pads 158, and thus can provide first level fan-out routing/interconnection for a semiconductor device to be assembled thereon. Optionally, the stacking pads 139 of the first routing circuitry 120 is to provide electrical contacts for another semiconductor device.

Figure 11:
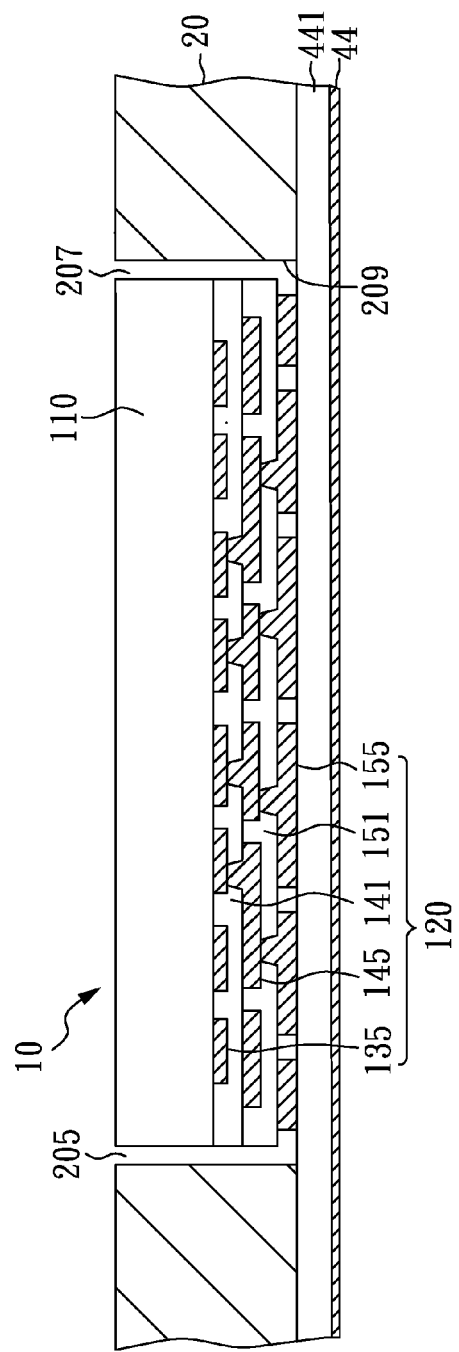
FIG. 11 is a cross-sectional view showing that the subcomponent of FIG. 10 and a first stiffener are placed on a third dielectric layer/a metal layer in accordance with the first embodiment of the present invention.

FIG. 11 is a cross-sectional view of the structure with the subcomponent 10 of FIG. 10 and a first stiffener 20 on a third dielectric layer 441 and a metal layer 44. The first stiffener 20 preferably has a thickness substantially the same as that of the subcomponent 10. The first stiffener 20 can be made of ceramic, metal, resin, composites of metal, or a single or multi-layer circuitry structure which has enough mechanical robustness and a through opening 205. The through openings 205 has an interior sidewall surface 209 that extends through the first stiffener 20, and preferably has a dimension that is substantially the same or slightly larger than the subcomponent 10. In this illustration, the through openings 205 has a dimension slightly larger than the subcomponent 10, and can be formed by laser cutting, punching or mechanical drilling. The subcomponent 10 is positioned within the through opening 205 of the first stiffener 20. The third dielectric layer 441 is sandwiched between the subcomponent 10 and the metal layer 44 and between the first stiffener 20 and the metal layer 44, and contacts the second conductive traces 155 of the subcomponent 10 and the first stiffener 20. The third dielectric layer 441 can be formed of epoxy resin, glass-epoxy, polyimide and the like, and typically has a thickness of 50 microns. The metal layer 44 typically is a copper layer with a thickness of 25 microns. The surface of second conductive traces 155 is substantially coplanar with a surface of the first stiffener 20 in the downward direction, and a gap 207 is located in the through opening 205 between the subcomponent 10 and the first stiffener 20. The gap 207 is laterally surrounded by the first stiffener 20, and laterally surrounds the sacrificial carrier 110 and the first routing circuitry 120.

Figure 12:
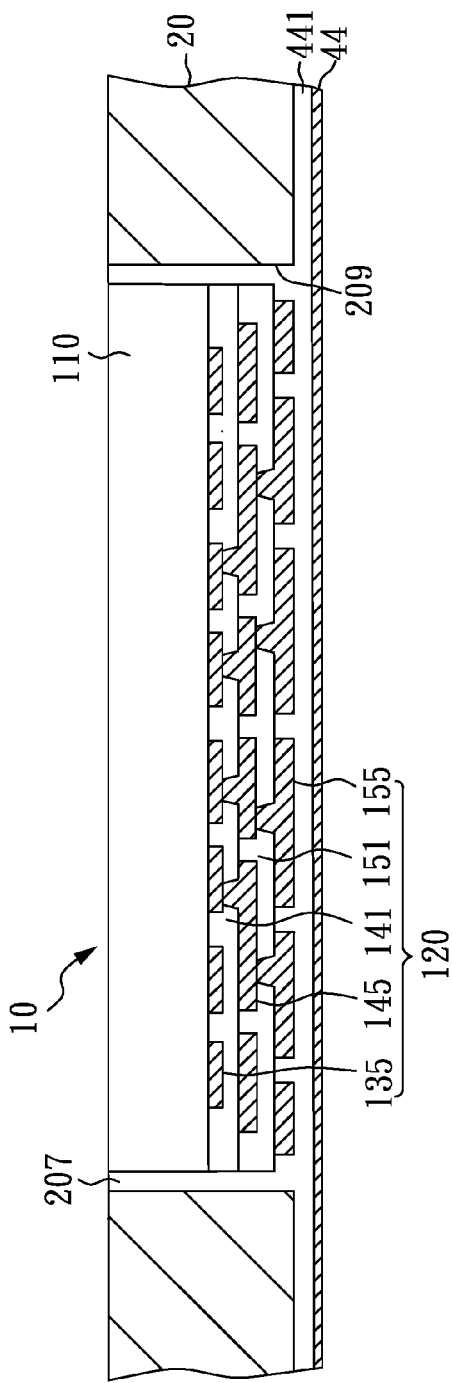
FIG. 12 is a cross-sectional view showing that the structure of FIG. 11 is subjected to a lamination process in accordance with the first embodiment of the present invention.

FIG. 12 is a cross-sectional view of the structure with the third dielectric layer 441 forced into the gap 207. The third dielectric layer 441 is flowed into the gap 207 by applying heat and pressure. Under the heat and pressure, the third dielectric layer 441 becomes compliant enough to conform to virtually any shape. As a result, the third dielectric layer 441 sandwiched between the subcomponent 10 and the metal layer 44 and between the first stiffener 20 and the metal layer 44 is compressed, forced out of its original shape and flows into and upward in the gap 207 to conformally coat the interior sidewall surface 209 of the first stiffener 20 and peripheral edges of the sacrificial carrier 110 and the first routing circuitry 120. The third dielectric layer 441 as solidified provides secure robust mechanical bonds between the subcomponent 10 and the first stiffener 20, between the subcomponent 10 and the metal layer 44 and between the first stiffener 20 and the metal layer 44, and thus retains the subcomponent 10 within the through opening 205 of the first stiffener 20.

Figure 13:
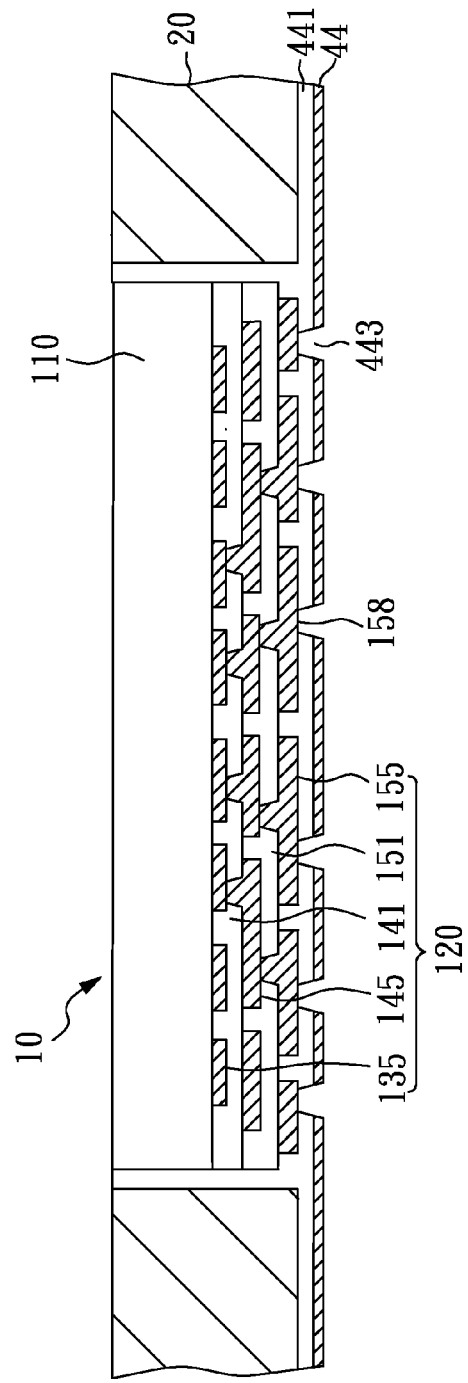
FIG. 13 is a cross-sectional view showing that the structure of FIG. 12 is provided with third via openings in accordance with the first embodiment of the present invention.

FIG. 13 is a cross-sectional view of the structure provided with the third via openings 443 to expose the contact pads 158 of the second conductive traces 155. The third via openings 443 extend through the metal layer 44 and the third dielectric layer 441, and are aligned with the contact pads 158 of the second conductive traces 155. Like the first and second via openings 143, 153, the third via openings 443 can be formed by any of numerous techniques including laser drilling, plasma etching and photolithography and typically have a diameter of 50 microns.

Figure 14:
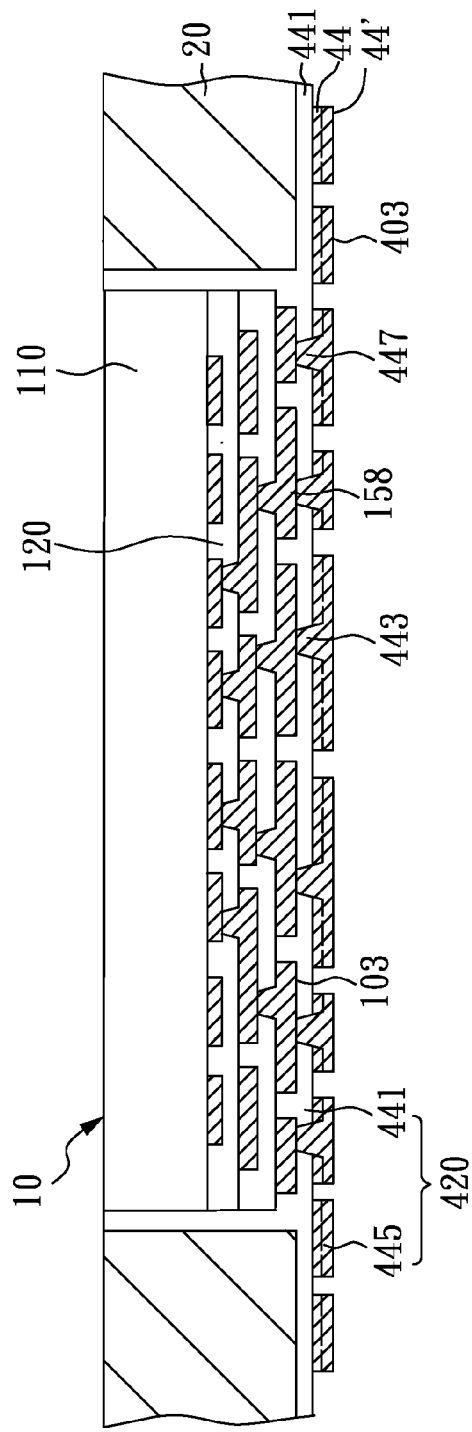
FIG. 14 is a cross-sectional view showing that the structure of FIG. 13 is provided with third conductive traces in accordance with the first embodiment of the present invention.

Referring now to FIG. 14, third conductive traces 445 are formed on the third dielectric layer 441 by depositing a plated layer 44' on the metal layer 44 and into the third via openings 443 and then patterning the metal layer 44 as well as the plated layers 44' thereon. The third conductive traces 445 extend from the contact pads 158 in the downward direction, fill up the third via openings 443 to form third metallized vias 447 in direct contact with the contact pads 158, and extend laterally on the third dielectric layer 441.

The metal layer 44 and the plated layer 44' are shown as a single layer for convenience of illustration. The boundary (shown in broken lines) between the metal layers may be difficult or impossible to detect since copper is plated on copper.

At this stage, the formation of a second routing circuitry 420 on the subcomponent 10 and the first stiffener 20 is accomplished. The second routing circuitry 420 laterally extends beyond peripheral edges of the first routing circuitry 120 and over a surface of the first stiffener 20, and has a third surface 403 facing away from the second surface 103 of the first routing circuitry 120. In this illustration, the second routing circuitry 420 includes a third dielectric layer 441 and third conductive traces 445, and substantially has a combined surface area of the first routing circuitry 120 and the first stiffener 20.

Figure 15:
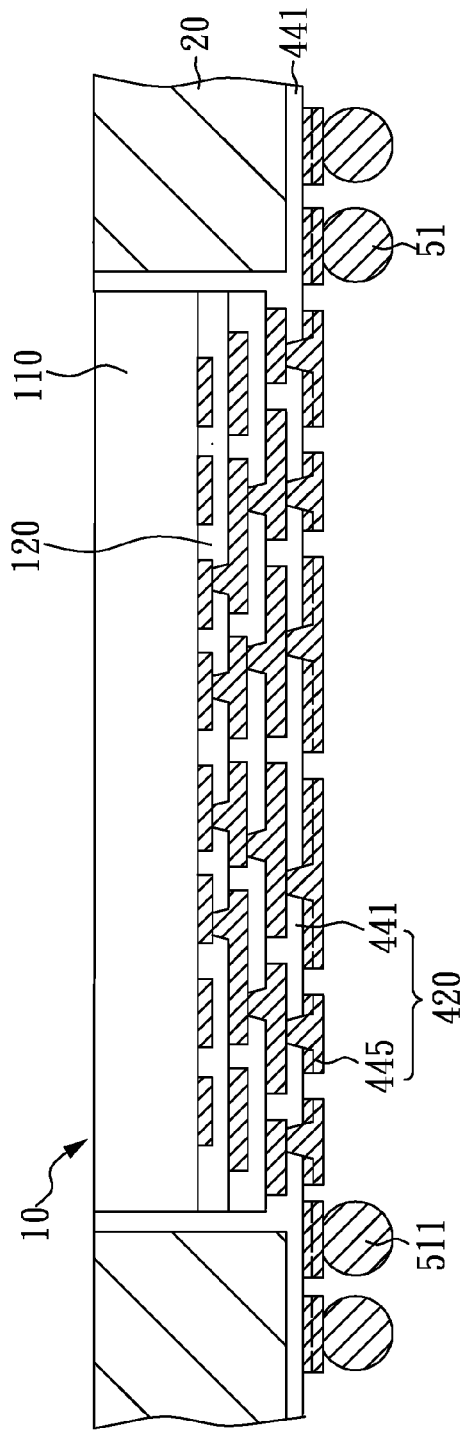
FIG. 15 is a cross-sectional view showing that the structure of FIG. 14 is provided with solder balls in accordance with the first embodiment of the present invention.

FIG. 15 is a cross-sectional view of the structure provided with an array of vertical connecting channels 51 on the third surface 403 of the second routing circuitry 420. In this illustration, the vertical connecting channels 51 are illustrated as solder balls 511 and contact the third conductive traces 445 of the second routing circuitry 420.

Figure 16:
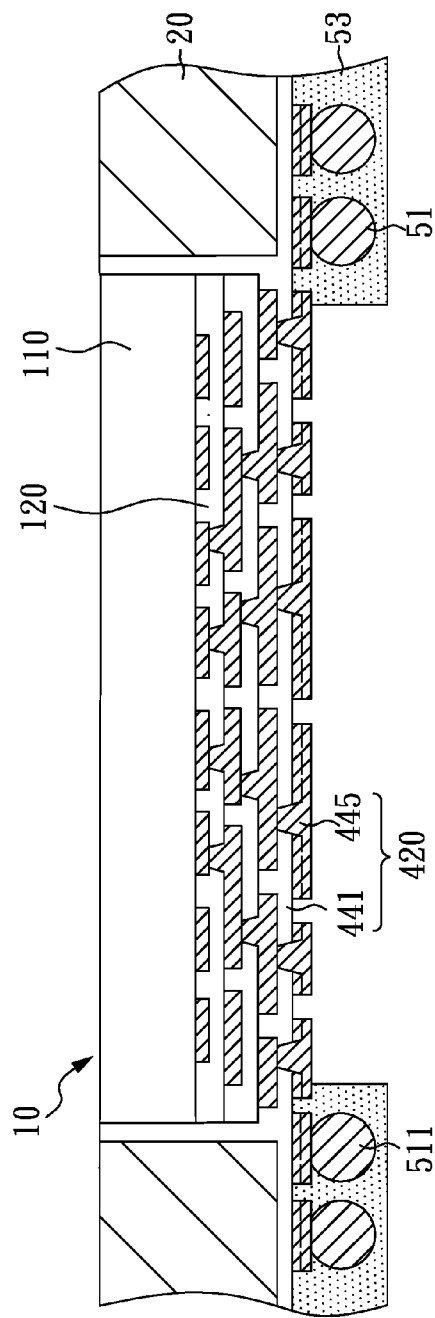
FIG. 16 is a cross-sectional view showing that the structure of FIG. 15 is provided with a second stiffener in accordance with the first embodiment of the present invention.

FIG. 16 is a cross-sectional view of the structure with a second stiffener 53 on the third surface 403 of the second routing circuitry 420. The second stiffener 53 is formed typically by printing or molding of resin sealant to cover the vertical connecting channels 51 and a selected portion of the second routing circuitry 420 from below and surround and conformally coat and cover the vertical connecting channels 51 in the lateral directions.

Figure 17:
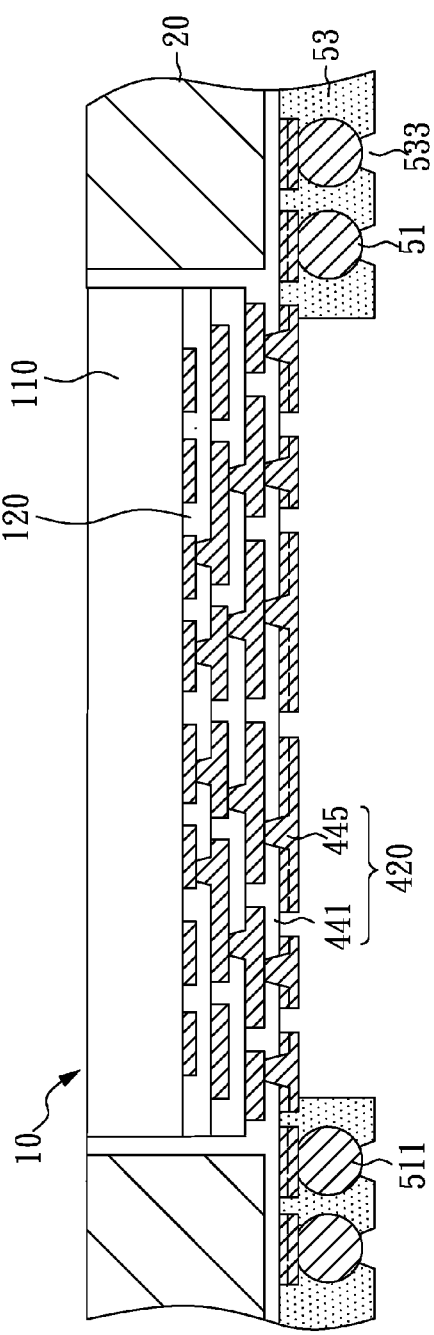
FIG. 17 is a cross-sectional view showing that the structure of FIG. 16 is provided with openings in accordance with the first embodiment of the present invention.

FIG. 17 is a cross-sectional view of the structure provided with openings 533 in the second stiffener 53. The openings 533 are aligned with the vertical connecting channels 51 to expose the vertical connecting channels 51 from below.

Figure 18:
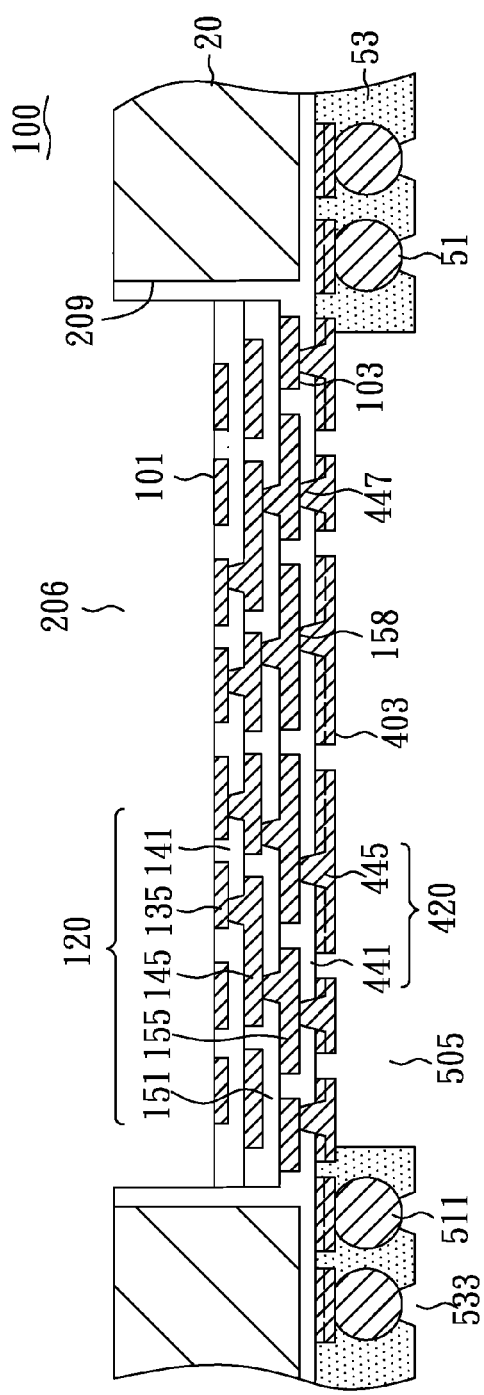
FIG. 18 is a cross-sectional view showing that the sacrificial carrier is removed from the structure of FIG. 17 to finish the fabrication of a wiring board in accordance with the first embodiment of the present invention.

FIG. 18 is a cross-sectional view of the structure after removal of the sacrificial carrier 110. The sacrificial carrier 110 can be removed by numerous techniques including wet chemical etching using acidic solution (e.g., ferric chloride, copper sulfate solutions), or alkaline solution (e.g., ammonia solution), electro-chemical etching, or mechanical process such as a drill or end mill followed by chemical etching. In this embodiment, the sacrificial carrier 110 made of an iron-based material is removed by a chemical etching solution that is selective between copper and iron so as to prevent the copper routing traces 135 from being etched during removal of the sacrificial carrier 110.

Accordingly, as shown in FIG. 18 a wiring board 100 is accomplished and includes a first stiffener 20, a first routing circuitry 120, a second routing circuitry 420, vertical connecting channels 51 and a second stiffener 53, and both the first routing circuitry 120 and the second routing circuitry 420 are buildup routing circuitries without a core layer.

The first routing circuitry 120 is positioned within the through opening 205 of the first stiffener 20 and adjacent to the interior sidewall surface 209 of the first stiffener 20, and has the first surface 101 exposed from the through opening 205 of the first stiffener 20. The second routing circuitry 420 is positioned beyond the through opening 205 of the first stiffener 20 and over the second surface 103 of the first routing circuitry 120, and laterally extends to peripheral edges of the wiring board 100. As such, the first surface 101 of the first routing circuitry 120 has a smaller surface area than that of the second routing circuitry 420 (namely, the area of the lower surface of the third dielectric layer 441). The first routing circuitry 120 is a multi-layered routing circuitry and contains a pattern of traces that fan out from a finer pitch at the first surface 101 to a coarser pitch at the second surface 103.

The second routing circuitry 420 is electrically coupled to the contact pads 158 of the first routing circuitry 120 through the third metallized vias 447 of the second routing circuitry 420, and includes third conductive traces 445 extending into an area outside of the through opening 205 of the first stiffener 20 and laterally extending over the surface of the first stiffener 20. As such, the second routing circuitry 420 not only provides further fan-out wiring structure for the first routing circuitry 120, but also mechanically binds the first routing circuitry 120 with the first stiffener 20.

The first stiffener 20 surrounds peripheral edges of the first routing circuitry 120 and laterally extends to the peripheral edges of the wiring board 100, can provide mechanical support and suppress warping and bending of the wiring board 100. The first stiffener 20 also extends beyond the first surface 101 of the first routing circuitry 120 in the upward direction to form a cavity 206 in the through opening 205 of the first stiffener 20.

The vertically connecting channels 51 are placed at the peripheral area of the third surface 403 of the second routing circuitry 420 and sealed in the second stiffener 53 and exposed from openings 533 in the second stiffener 53. As a result, the vertically connecting channels 51 can provide electrical contacts for next-level connection.

The second stiffener 53 is disposed over the third surface 403 of the second routing circuitry 420 and has an aperture 505 centrally aligned with the through opening 205 of the first stiffener 20. As a result, the dual support from the first stiffener 20 and the second stiffener 53 at two opposite sides of the wiring board 100 can effectively prevent the wiring board 100 from warping.

Figure 19:
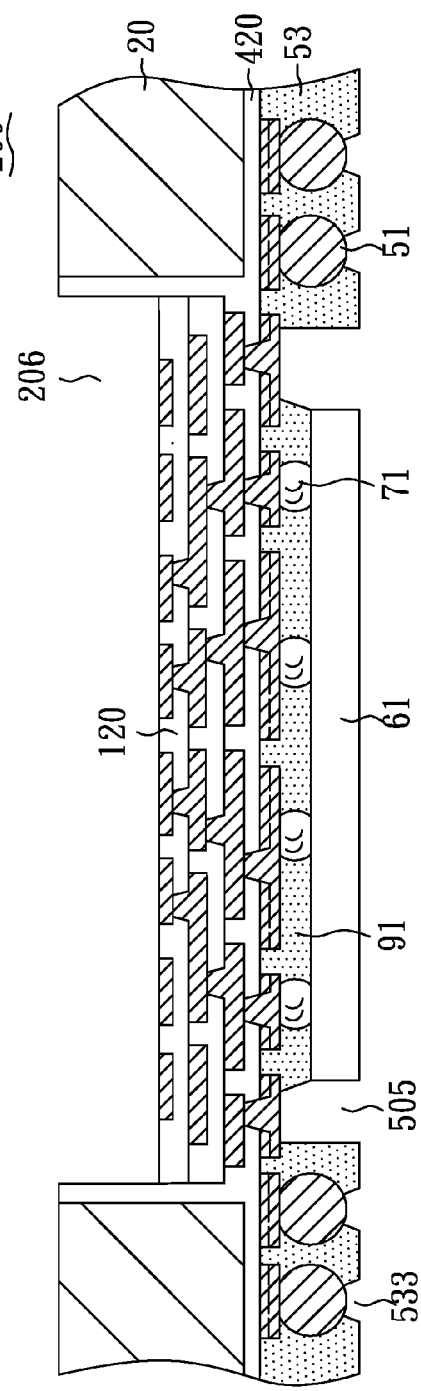
FIG. 19 is a cross-sectional view of another aspect of wiring board in accordance with the first embodiment of the present invention.

FIG. 19 is a cross-sectional view of another aspect of wiring board 200 with an electronic component 61 within the aperture 505 of the second stiffener 53. The wiring board 200 is similar to the wiring board 100 illustrated in FIG. 18, except that the wiring board 200 further includes an electronic component 61 disposed over the third surface 403 of the second routing circuitry 420. The electronic component 61, illustrated as a chip, is electrically coupled to the second routing circuitry 420 through bumps 71 on the third conductive traces 445 of the second routing circuitry 420. Optionally, a filler material 91 can be further provided to fill the gap between the electronic component 61 and the second routing circuitry 420 of the wiring board 200.

Figure 20:
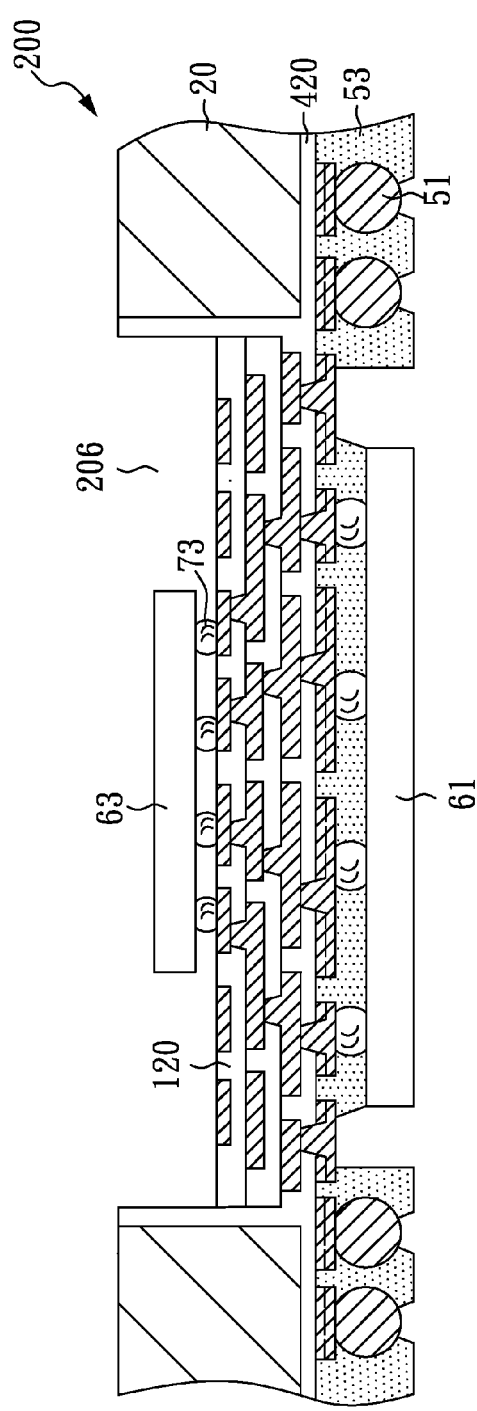
FIG. 20 is a cross-sectional view of a semiconductor assembly with a first semiconductor device mounted on the wiring board of FIG. 19 in accordance with the first embodiment of the present invention.

FIG. 20 is a cross-sectional view of a semiconductor assembly with a first semiconductor device 63, illustrated as a chip, mounted on the wiring board 200 illustrated in FIG. 19. The first semiconductor device 63 is positioned within the cavity 206 and is flip-chip mounted on the exposed bond pads 138 of the first routing circuitry 120 via bumps 73. As a result, the first semiconductor device 63 is face-to-face electrically connected to the electronic component 61 through the combination of the first routing circuitry 120 and the second routing circuitry 420.

Figure 21:
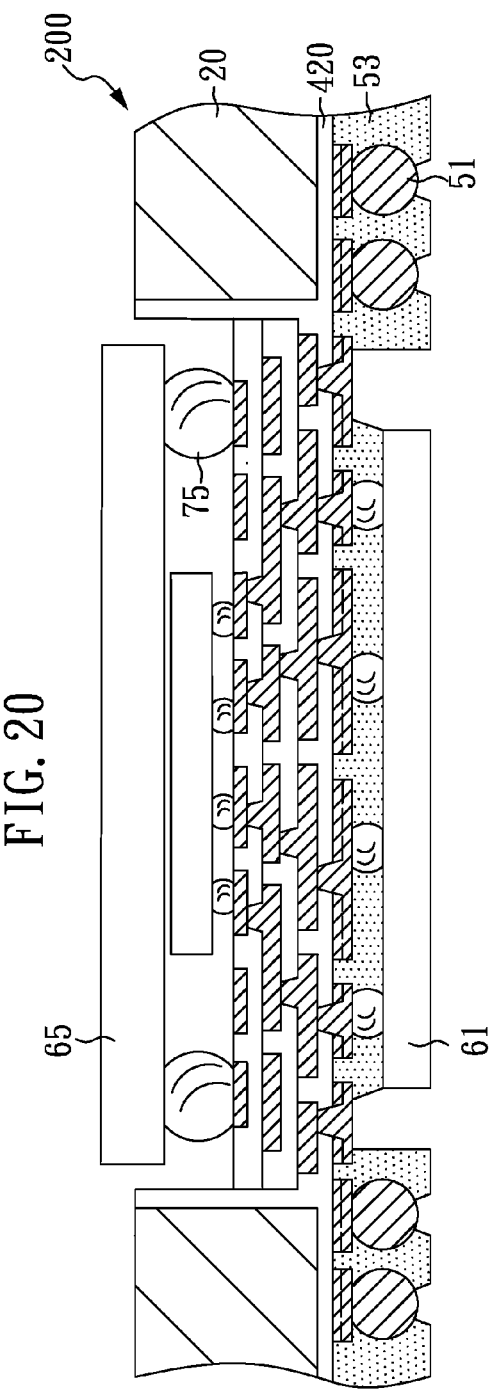
FIG. 21 is a cross-sectional view of a package-on-package assembly with a second semiconductor device further electrically coupled to the semiconductor assembly of FIG. 20 in accordance with the first embodiment of the present invention.

FIG. 21 is a cross-sectional view of a package-on-package assembly with a second semiconductor device 65 further electrically coupled to the stacking pads 139 of the first routing circuitry 120 via solder balls 75. Accordingly, the second semiconductor device 65 can be electrically connected to the first semiconductor device 63 through the first routing circuitry 120 of the wiring board 200 and electrically connected to the electronic component 61 through the first routing circuitry 120 and the second routing circuitry 420.

Embodiment 2

FIGS. 22-31 are schematic views showing a method of making a wiring board with an electronic component encapsulated by the second stiffener in accordance with the second embodiment of the present invention.

For purposes of brevity, any description in Embodiment 1 above is incorporated herein insofar as the same is applicable, and the same description need not be repeated.

Figure 22:
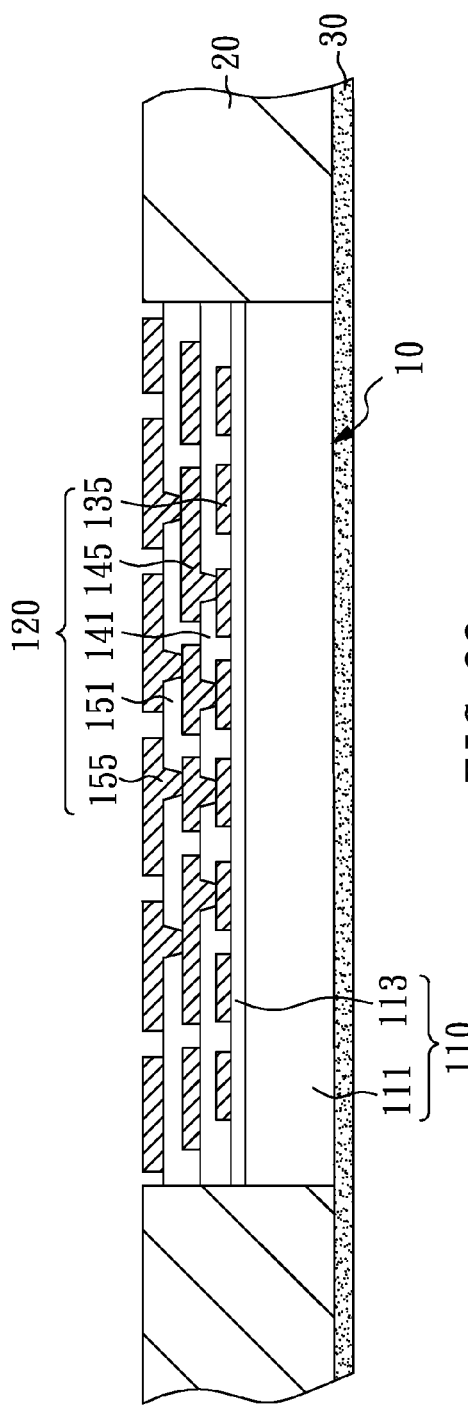
FIG. 22 is a cross-sectional view showing that a subcomponent and a first stiffener are attached on a carrier film in accordance with the second embodiment of the present invention.

FIG. 22 is a cross-sectional view of a subcomponent 10 and a first stiffener 20 on a carrier film 30. The subcomponent 10 is similar to that illustrated in FIG. 10, except that the sacrificial carrier 110 is a double-layer structure in this embodiment. The subcomponent 10 is located within the through opening 205 of the first stiffener 20 with the sacrificial carrier 110 attached on the carrier film 30. The carrier film 30 typically is a tape and can provide temporary retention force for the subcomponent 10 steadily resided within the through opening 205. In this illustration, the subcomponent 10 and the first stiffener 20 are attached to the carrier film 30 by the adhesive property of the carrier film 30. Alternatively, the subcomponent 10 and the first stiffener 20 may be attached to the carrier film 30 by dispensing extra adhesive. After the insertion of the subcomponent 10 into the through opening 205, the second surface 103 of the first routing circuitry 120 is substantially coplanar with a surface of the first stiffener 20 in the upward direction. In the case of the through opening 205 having a slightly larger area than the subcomponent 10, an adhesive (not shown in the figure) may be optionally dispensed in a gap (not shown in the figure) located in the through opening 205 between the subcomponent 10 and the first stiffener 20 to provide secure robust mechanical bonds between the first routing circuitry 120 and the first stiffener 20. The sacrificial carrier 110 includes a support sheet 111 and a barrier layer 113 deposited on the support sheet 111, and the first routing circuitry 120 is formed on the barrier layer 113. The barrier layer 113 can have a thickness of 0.001 to 0.1 mm, and may be a metal layer that is inactive against chemical etching during chemically removing the support sheet 111 and can be removed without affecting the routing traces 135. For instance, the barrier layer 113 may be made of tin or nickel when the support sheet 111 and the routing traces 135 are made of copper. Further, in addition to metal materials, the barrier layer 113 can also be a dielectric layer such as a peelable laminate film. In this embodiment, the support sheet 111 is a copper sheet, and the barrier layer 113 is a nickel layer of 3 microns in thickness.

Figure 23:
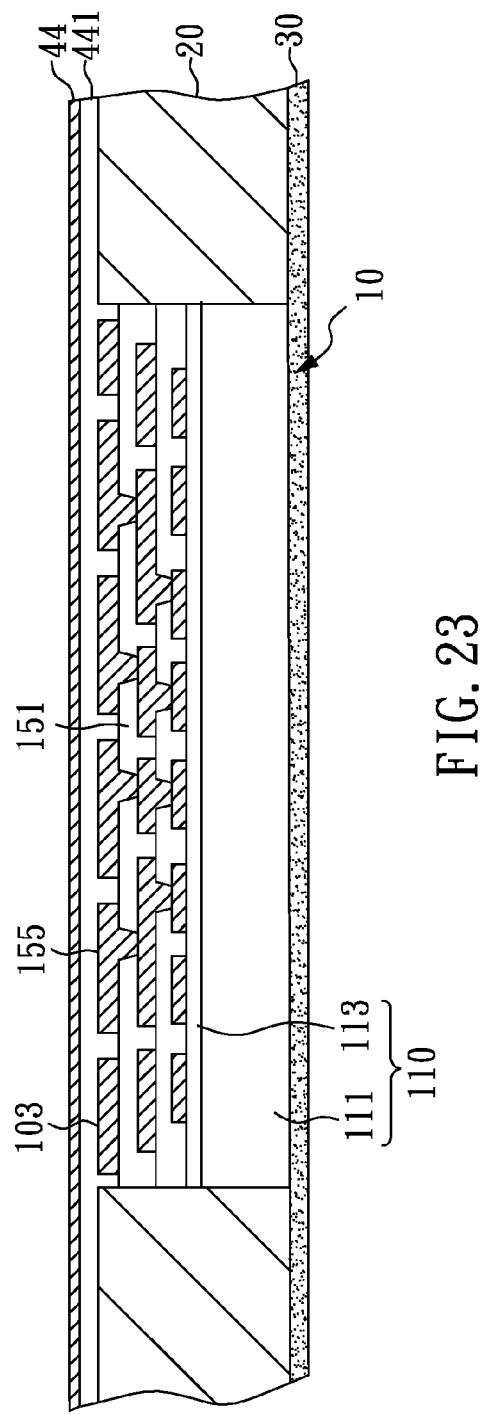
FIG. 23 is a cross-sectional view showing that a third dielectric layer and a metal layer are disposed on the structure of FIG. 22 in accordance with the second embodiment of the present invention.

FIG. 23 is a cross-sectional view of the structure with a third dielectric layer 441 and a metal layer 44 laminated/coated on the subcomponent 10 and the first stiffener 20 from above. The third dielectric layer 441 contacts and is sandwiched between the second dielectric layer 151/the second conductive traces 155 and the metal layer 44 and between the first stiffener 20 and the metal layer 44.

Figure 24:
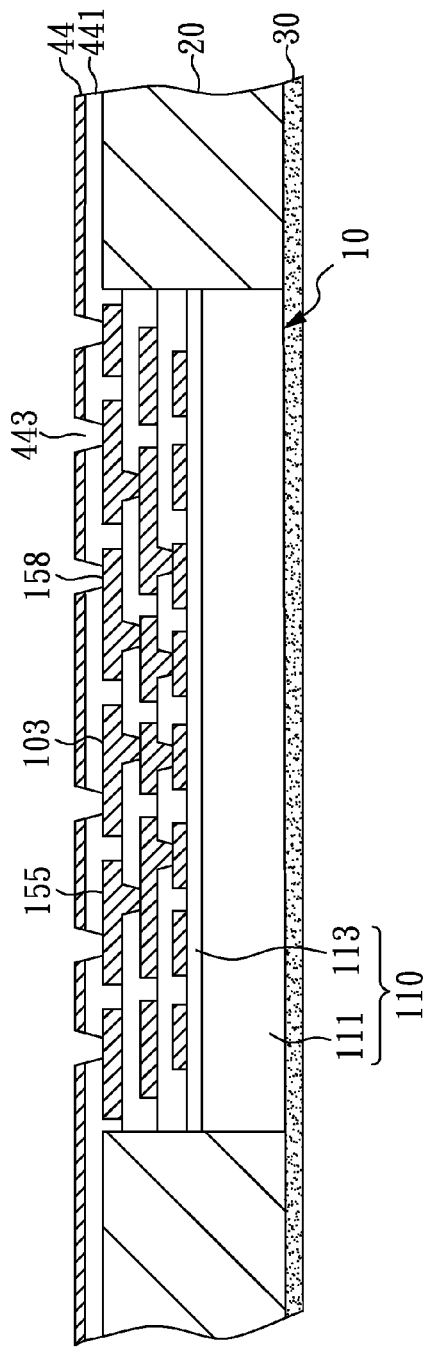
FIG. 24 is a cross-sectional view showing that the structure of FIG. 23 is provided with third via openings in accordance with the second embodiment of the present invention.

FIG. 24 is a cross-sectional view of the structure provided with the third via openings 443 to expose the contact pads 158 of the second conductive traces 155. The third via openings 443 extend through the metal layer 44 and the third dielectric layer 441, and are aligned with the contact pads 158 of the second conductive traces 155.

Figure 25:
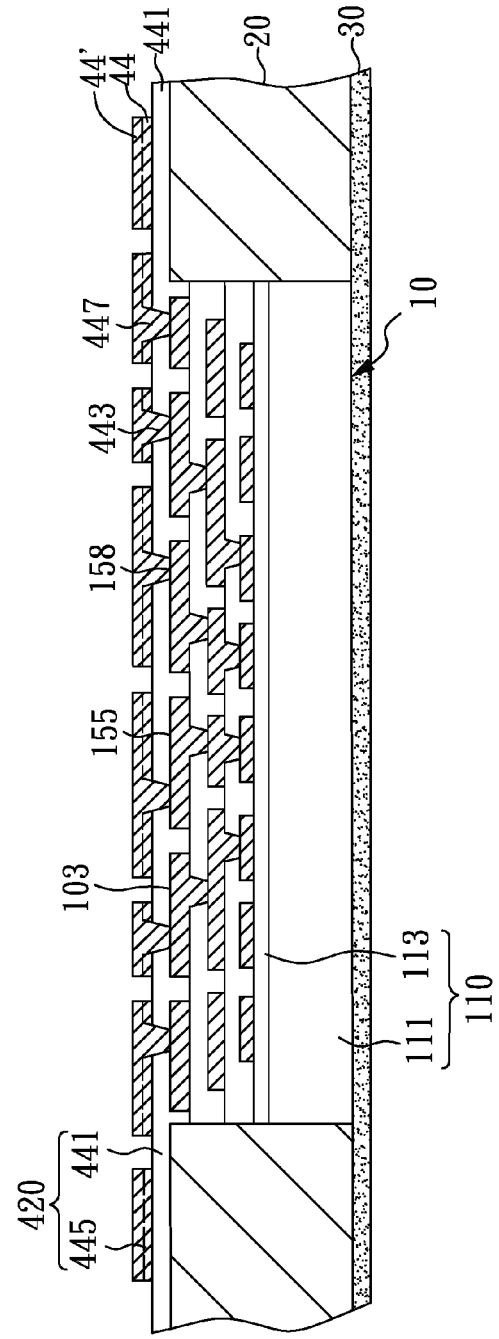
FIG. 25 is a cross-sectional view showing that the structure of FIG. 24 is provided with third conductive traces in accordance with the second embodiment of the present invention.

FIG. 25 is a cross-sectional view of the structure provided with third conductive traces 445 on the third dielectric layer 441. The third conductive traces 445 are formed by depositing a plated layer 44' on the metal layer 44 and into the third via openings 443 and then patterning the metal layer 44 as well as the plated layers 44' thereon. The third conductive traces 445 extend from the contact pads 158 in the upward direction, fill up the third via openings 443 to form third metallized was 447 in direct contact with the contact pads 158, and extend laterally on the third dielectric layer 441.

At this stage, the formation of a second routing circuitry 420 on the first routing circuitry 120 and the first stiffener 20 is accomplished. In this illustration, the second routing circuitry 420 includes a third dielectric layer 441 and third conductive traces 445.

Figure 26:
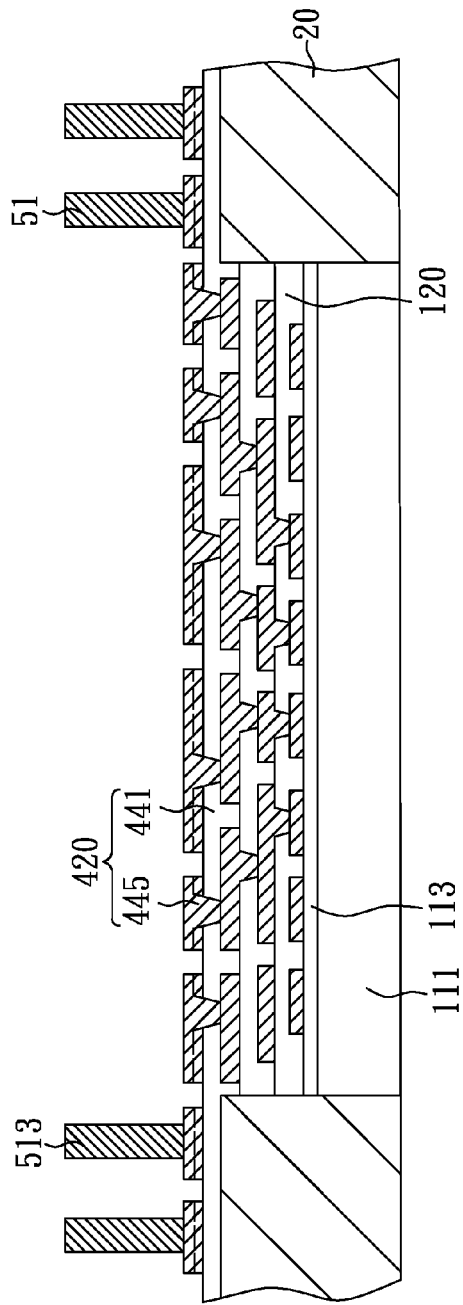
FIG. 26 is a cross-sectional view showing that the structure of FIG. 25 is provided with metal pillars in accordance with the second embodiment of the present invention.

FIG. 26 is a cross-sectional view of the structure after removal of the carrier film 30 and deposition of vertical connecting channels 51 on the second routing circuitry 420. The carrier film 30 is detached from the sacrificial carrier 110 and the first stiffener 20, followed by forming the vertical connecting channels 51 on the third conductive traces 445 of the second routing circuitry 420. In this illustration, the vertical connecting channels 51 are illustrated as metal pillars 513 and electrically connected to the second routing circuitry 420.

Figure 27:
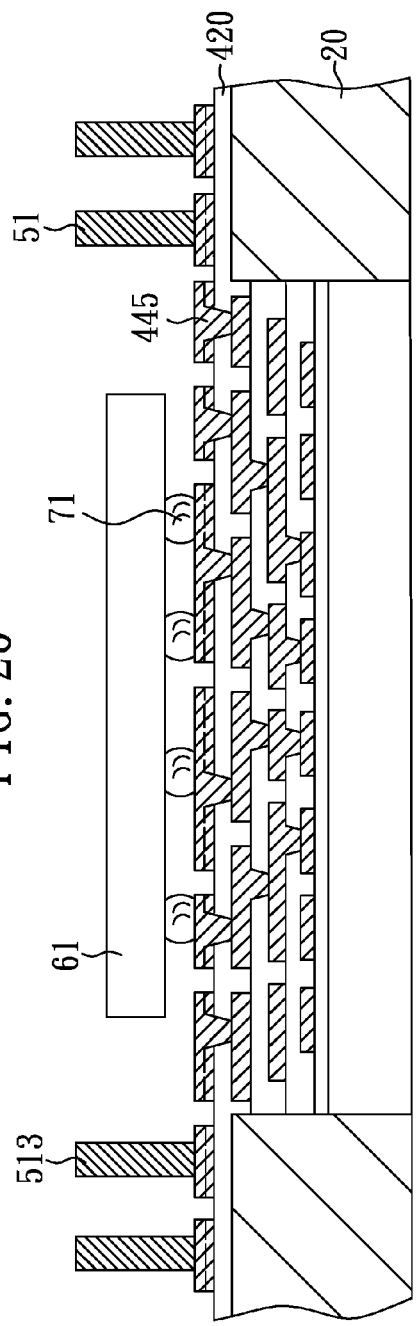
FIG. 27 is a cross-sectional view showing that the structure of FIG. 26 is provided with an electronic component in accordance with the second embodiment of the present invention.

FIG. 27 is a cross-sectional view of the structure with an electronic component 61 mounted on the second routing circuitry 420. The electronic component 61, illustrated as a chip, is electrically coupled to the second routing circuitry 420 through bumps 71 on the third conductive traces 445 of the second routing circuitry 420.

Figure 28:
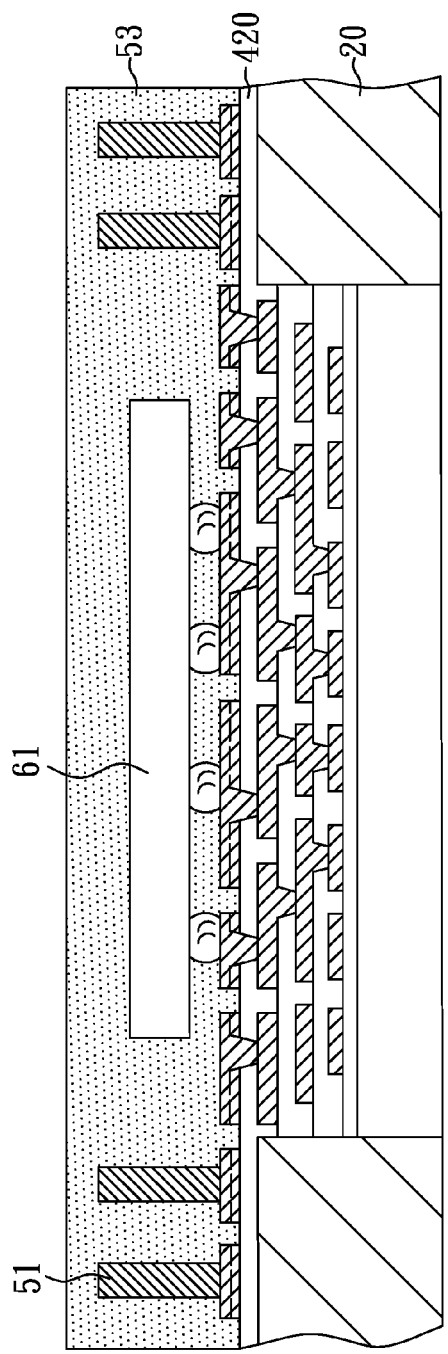
FIG. 28 is a cross-sectional view showing that the structure of FIG. 27 is provided with a second stiffener in accordance with the second embodiment of the present invention.

FIG. 28 is a cross-sectional view of the structure provided with a second stiffener 53 on the second routing circuitry 420. The second stiffener 53 covers the second routing circuitry 420, the vertical connecting channels 51 and the electronic component 61 from above and surrounds and conformally coats and covers sidewalls of the vertical connecting channels 51 and the electronic component 61.

Figure 29:
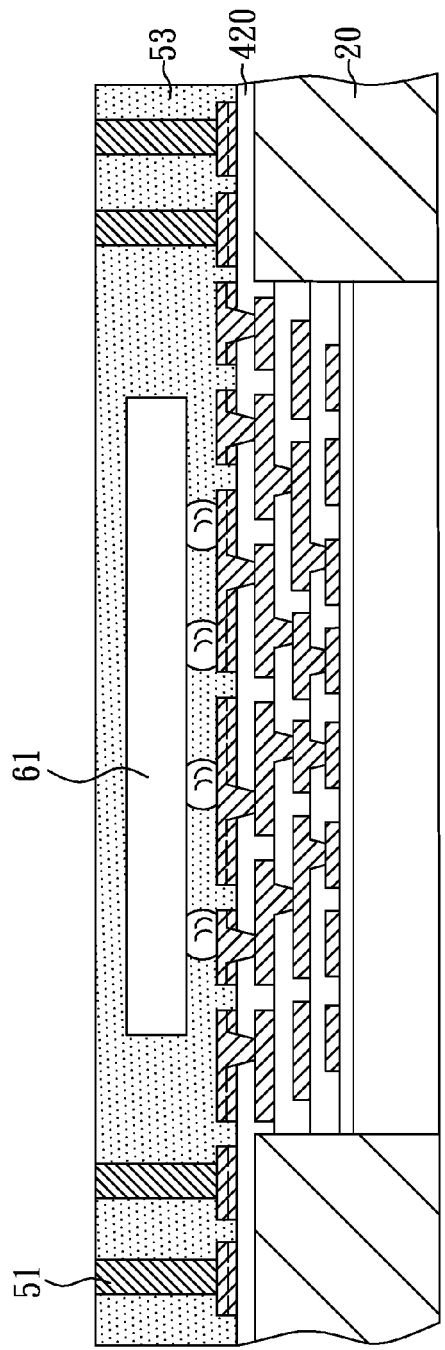
FIG. 29 is a cross-sectional view showing that a top portion of the second stiffener is removed from the structure of FIG. 28 in accordance with the second embodiment of the present invention.

FIG. 29 is a cross-sectional view of the structure with the vertical connecting channels 51 exposed from the above by removing a top portion of the second stiffener 53. In this illustration, the exterior surface of the second stiffener 53 is substantially coplanar with the exposed surface of the vertical connecting channels 51.

Figure 30:
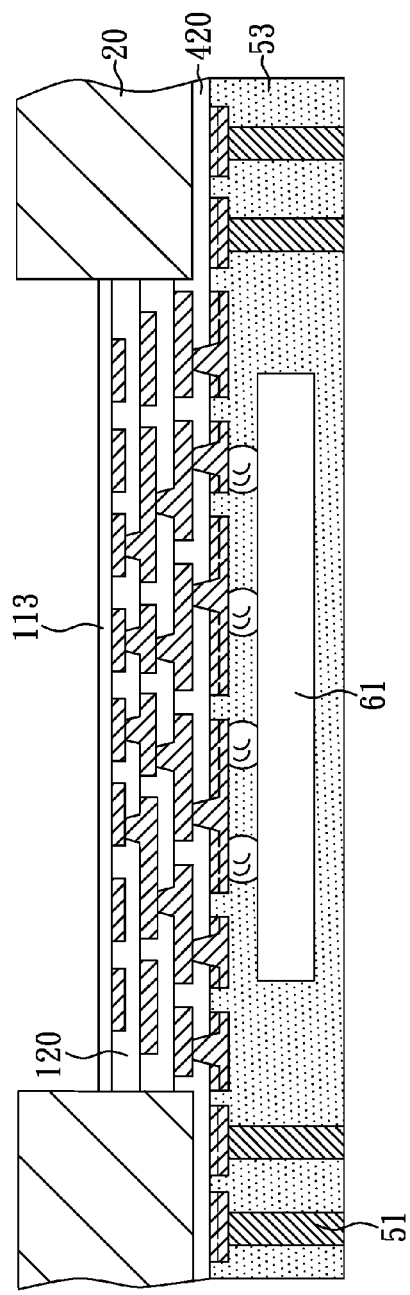
FIG. 30 is a cross-sectional view showing that the support sheet of the sacrificial carrier is removed from the structure of FIG. 29 in accordance with the second embodiment of the present invention.

FIG. 30 is a cross-sectional view of the structure after removal of the support sheet 111. The support sheet 111 made of copper is removed by an alkaline etching solution.

Figure 31:
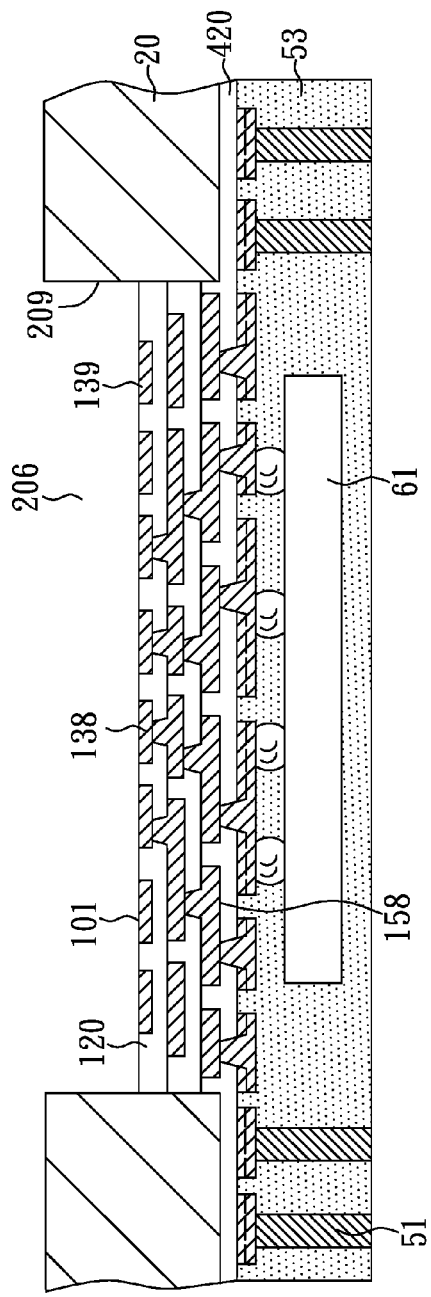
FIG. 31 is a cross-sectional view showing that the barrier layer of the sacrificial carrier is removed from the structure of FIG. 30 to finish the fabrication of a wiring board in accordance with the second embodiment of the present invention.

FIG. 31 is a cross-sectional view of the structure after removal of the barrier layer 113. The barrier layer 113 made of nickel is removed by an acidic etching solution to expose the first surface 101 of the first routing circuitry 120 from above. In another aspect of the barrier layer 113 being a peelable laminate film, the barrier layer 113 can be removed by mechanical peeling or plasma ashing. As a result, the first surface 101 of the first routing circuitry 120 and a portion of the interior sidewall surface 209 of the first stiffener 20 forms a cavity 206 in the through opening 205 of the first stiffener 20.

Accordingly, as shown in FIG. 31, a wiring board 300 is accomplished and includes a first stiffener 20, a first routing circuitry 120, a second routing circuitry 420, vertical connecting channels 51, a second stiffener 53 and an electronic component 61, and both the first routing circuitry 120 and the second routing circuitry 420 are buildup routing circuitries without a core layer.

The first routing circuitry 120 is positioned within the through opening 205 of the first stiffener 20, and the second routing circuitry 420 is positioned beyond the through opening 205 of the first stiffener 20 and extends to peripheral edges of the wiring board 300. In this illustration, the first routing circuitry 120 has bond pads 138 and stacking pads 139 at its first surface 101 and contact pads 158 at its second surface 103. As the size and pad spacing of the contact pads 158 are designed to be larger than those of the bond pads 138 that match I/O pads of a chip to be assembled thereon, the first routing circuitry 120 can provide a primary fan-out routing to ensure a higher manufacturing yield for the next level buildup circuitry interconnection. The second routing circuitry 420 contacts and laterally extends on the first routing circuitry 120 and the first stiffener 20, and is electrically coupled to the contact pads 158 of the first routing circuitry 120. The first stiffener 20 and the second stiffener 53 are disposed at two opposite sides of the wiring board 300 to prevent the wiring board 300 from warping. The vertical connecting channels 51 are sealed in the second stiffener 53 and electrically connected to the second routing circuitry 420 and exposed from the second stiffener 53. The electronic component 61 is encapsulated by the second stiffener 53 and laterally surrounded by the vertical connecting channels 51 and electrically coupled to the second routing circuitry 420.

Figure 32:
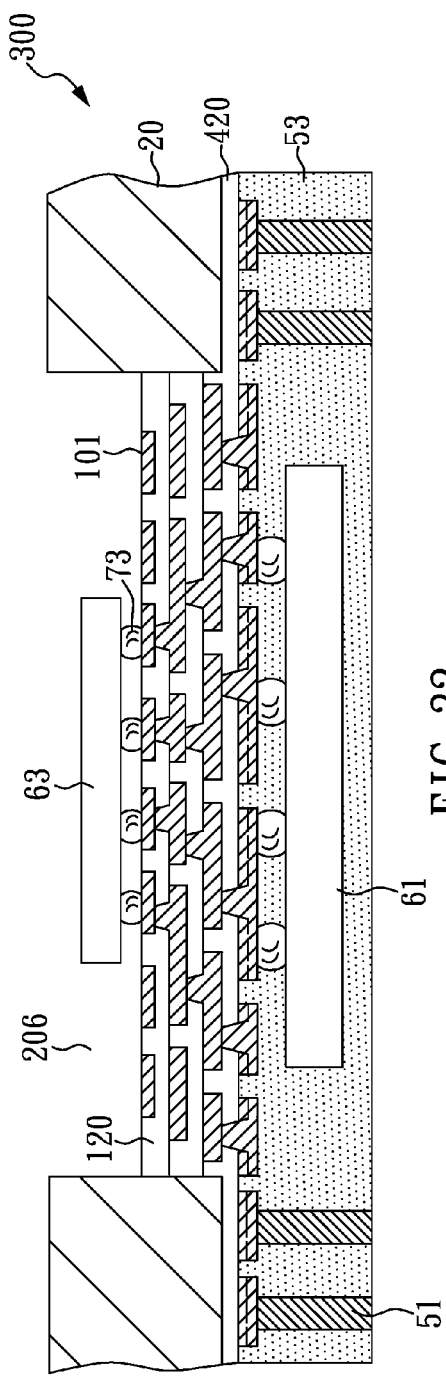
FIG. 32 is a cross-sectional view of a semiconductor assembly with a first semiconductor device mounted on the wiring board of FIG. 31 in accordance with the second embodiment of the present invention.

FIG. 32 is a cross-sectional view of a semiconductor assembly with a first semiconductor device 63, illustrated as a chip, mounted on the wiring board 300 illustrated in FIG. 31. The first semiconductor device 63 is positioned within the cavity 206 of the wiring board 300, and is flip-chip mounted on the exposed bond pads 138 of the first routing circuitry 120 via bumps 73.

Figure 33:
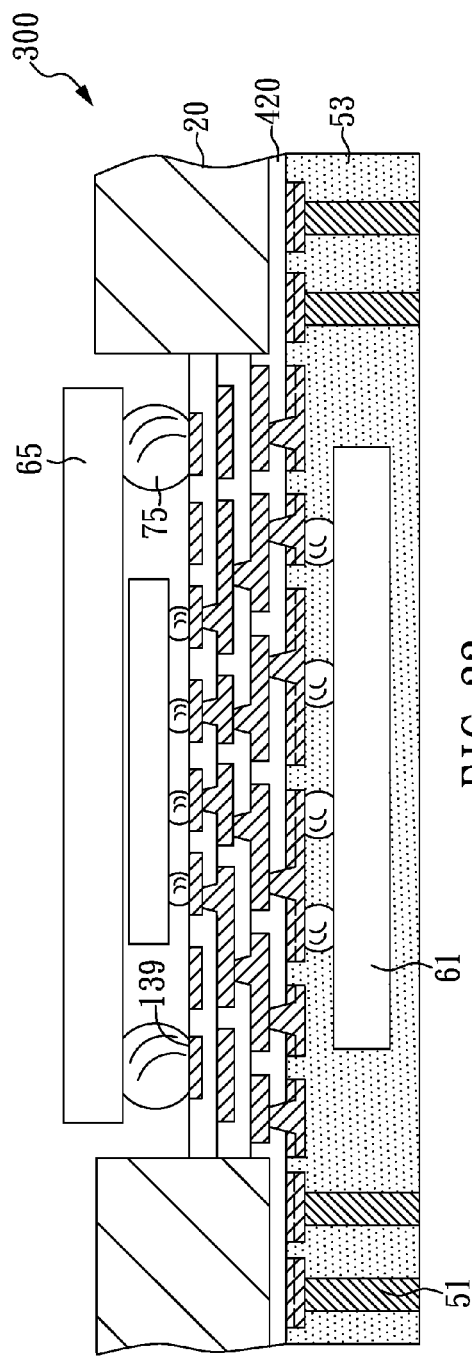
FIG. 33 is a cross-sectional view of a package-on-package assembly with a second semiconductor device further electrically coupled to the semiconductor assembly of FIG. 32 in accordance with the second embodiment of the present invention.

FIG. 33 is a cross-sectional view of a package-on-package assembly with a second semiconductor device 65 further electrically coupled to the stacking pads 139 of the first routing circuitry 120 via solder balls 75. Accordingly, the second semiconductor device 65 can be electrically connected to the first semiconductor device 63 through the first routing circuitry 120 of the wiring board 300 and electrically connected to the electronic component 61 through the first routing circuitry 120 and the second routing circuitry 420.

Embodiment 3

FIGS. 34-37 are schematic views showing a method of making a wiring board with a third routing circuitry in accordance with the third embodiment of the present invention.

For purposes of brevity, any description in aforementioned Embodiments above is incorporated herein insofar as the same is applicable, and the same description need not be repeated.

Figure 34:
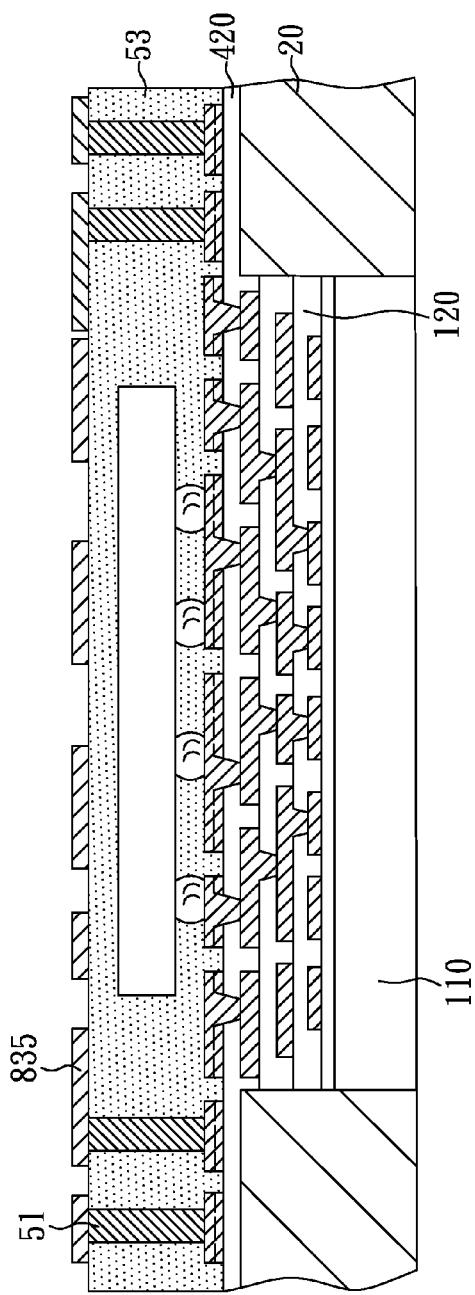
FIG. 34 is a cross-sectional view showing that the structure of FIG. 29 is provided with fourth conductive traces in accordance with the third embodiment of the present invention.

FIG. 34 is a cross-sectional view of the structure with fourth conductive traces 835 on the second stiffener 53 of FIG. 29. The fourth conductive traces 835 are formed by metal deposition and metal patterning process and laterally extend on the exterior surface of the second stiffener 53 and contact the vertical connecting channels 51.

Figure 35:
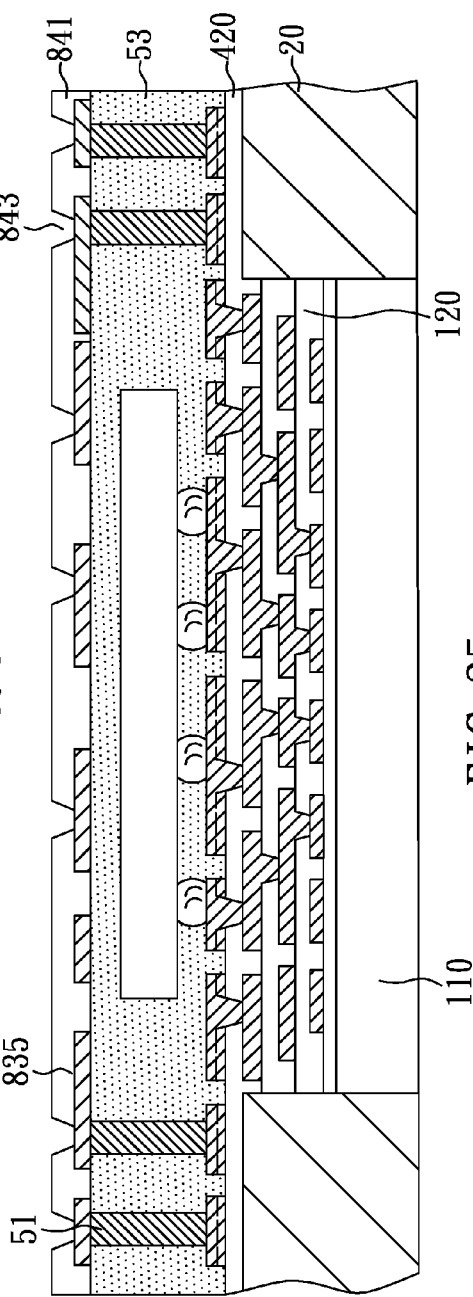
FIG. 35 is a cross-sectional view showing that the structure of FIG. 34 is provided with a fourth dielectric layer and fourth via openings in accordance with the third embodiment of the present invention.

FIG. 35 is a cross-sectional view of the structure provided with a fourth dielectric layer 841 on the second stiffener 53 as well as the fourth conductive traces 835 and fourth via openings 843 in the fourth dielectric layer 841. The fourth dielectric layer 841 is deposited typically by lamination or coating, and contacts and covers and extends laterally on the second stiffener 53 and the fourth conductive traces 835 from above. The fourth dielectric layer 841 typically has a thickness of 50 microns, and can be made of epoxy resin, glass-epoxy, polyimide, or the like. After the deposition of the fourth dielectric layer 841, the fourth via openings 843 are formed and extend through the fourth dielectric layer 841 to expose selected portions of the fourth conductive traces 835. The fourth via openings 843 can be formed by any of numerous techniques including laser drilling, plasma etching and photolithography and typically have a diameter of 50 microns.

Figure 36:
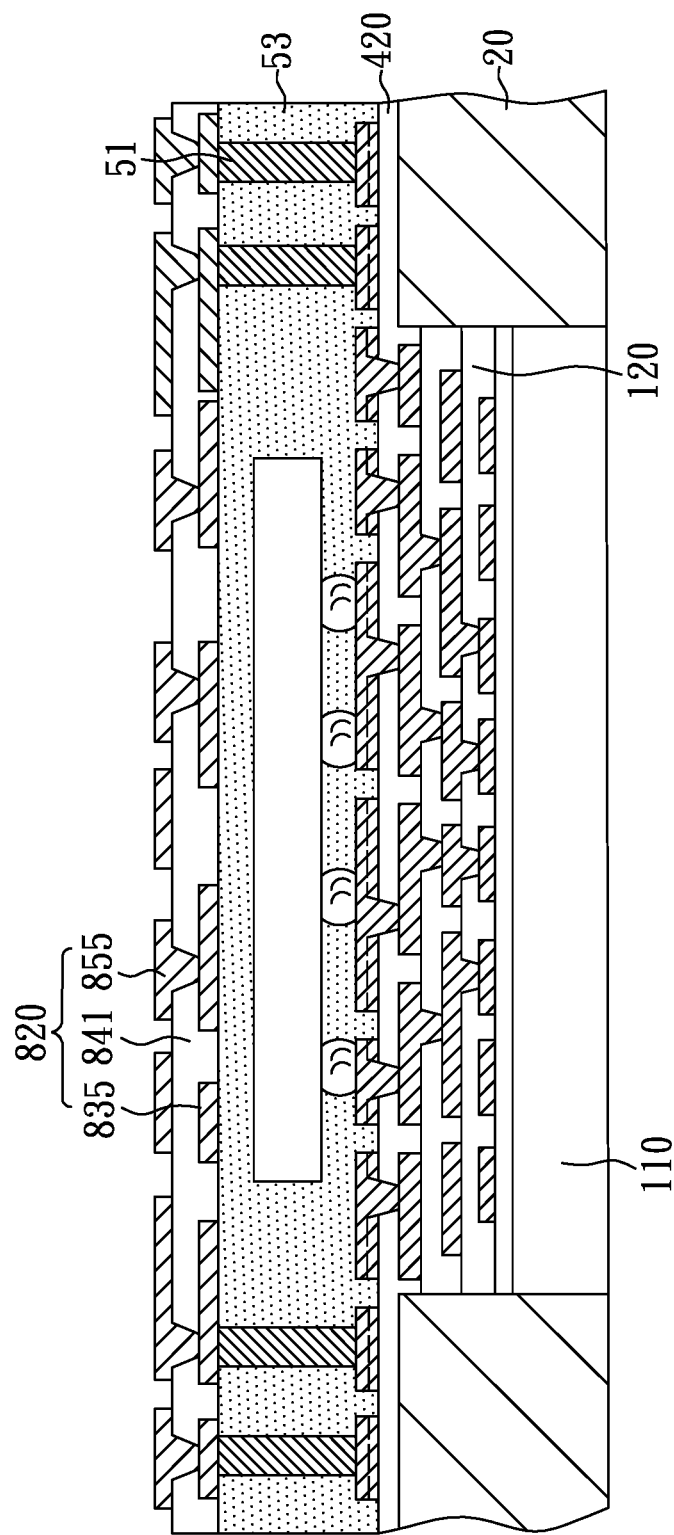
FIG. 36 is a cross-sectional view showing that the structure of FIG. 35 is provided with fifth conductive traces in accordance with the third embodiment of the present invention.

FIG. 36 is a cross-sectional view of the structure provided with fifth conductive traces 855 on the fourth dielectric layer 841 by metal deposition and metal patterning process. The fifth conductive traces 855 extend from the fourth conductive traces 835 in the upward direction, fill up the fourth via openings 843, and extend laterally on the fourth dielectric layer 841.

At this stage, the formation of a third routing circuitry 820 on the second stiffener 53 is accomplished. In this illustration, the third routing circuitry 820 includes fourth conductive traces 835, a fourth dielectric layer 841 and the fifth conductive traces 855.

Figure 37:
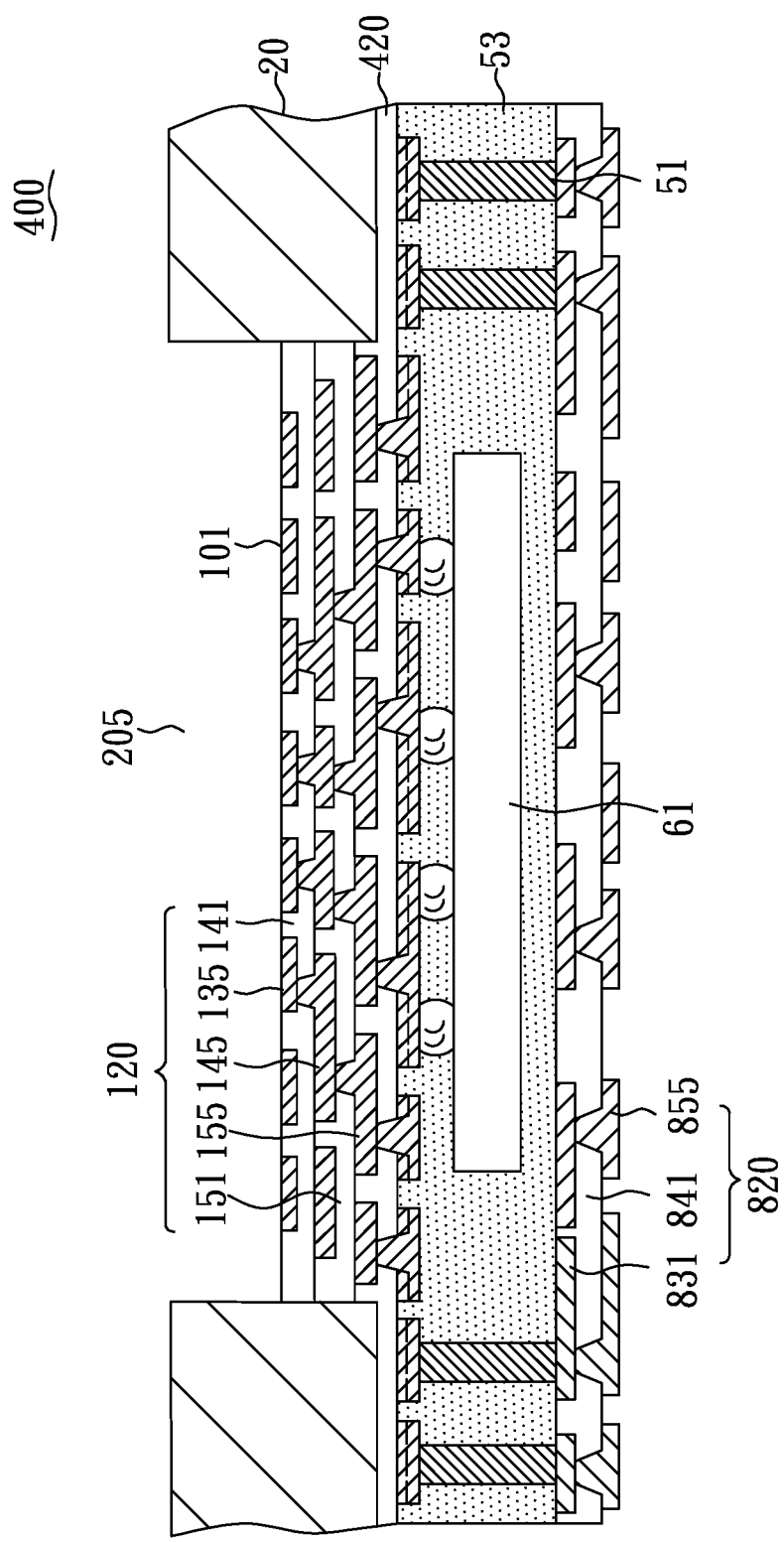
FIG. 37 is a cross-sectional view showing that the sacrificial carrier is removed from the structure of FIG. 36 to finish the fabrication of a wiring board in accordance with the third embodiment of the present invention.

FIG. 37 is a cross-sectional view of the structure after removal of the sacrificial carrier 110. As a result, the first surface 101 of the first routing circuitry 120 is exposed from the through opening 205 of the first stiffener 20.

Accordingly, as shown in FIG. 37, a wiring board 400 is accomplished and includes a first stiffener 20, a first routing circuitry 120, a second routing circuitry 420, vertical connecting channels 51, a second stiffener 53, an electronic component 61 and a third routing circuitry 820.

The first routing circuitry 120 is positioned within the through opening 205 of the first stiffener 20, and the second routing circuitry 420 is disposed on the first routing circuitry 120 and the first stiffener 20. The electronic component 61 is electrically coupled to the second routing circuitry 420 and encapsulated by the second stiffener 53 and laterally surrounded by the vertical connecting channels 51 in the second stiffener 53. The third routing circuitry 820 is disposed on the second stiffener 53 and electrically connected to the vertical connecting channels 51.

Figure 38:
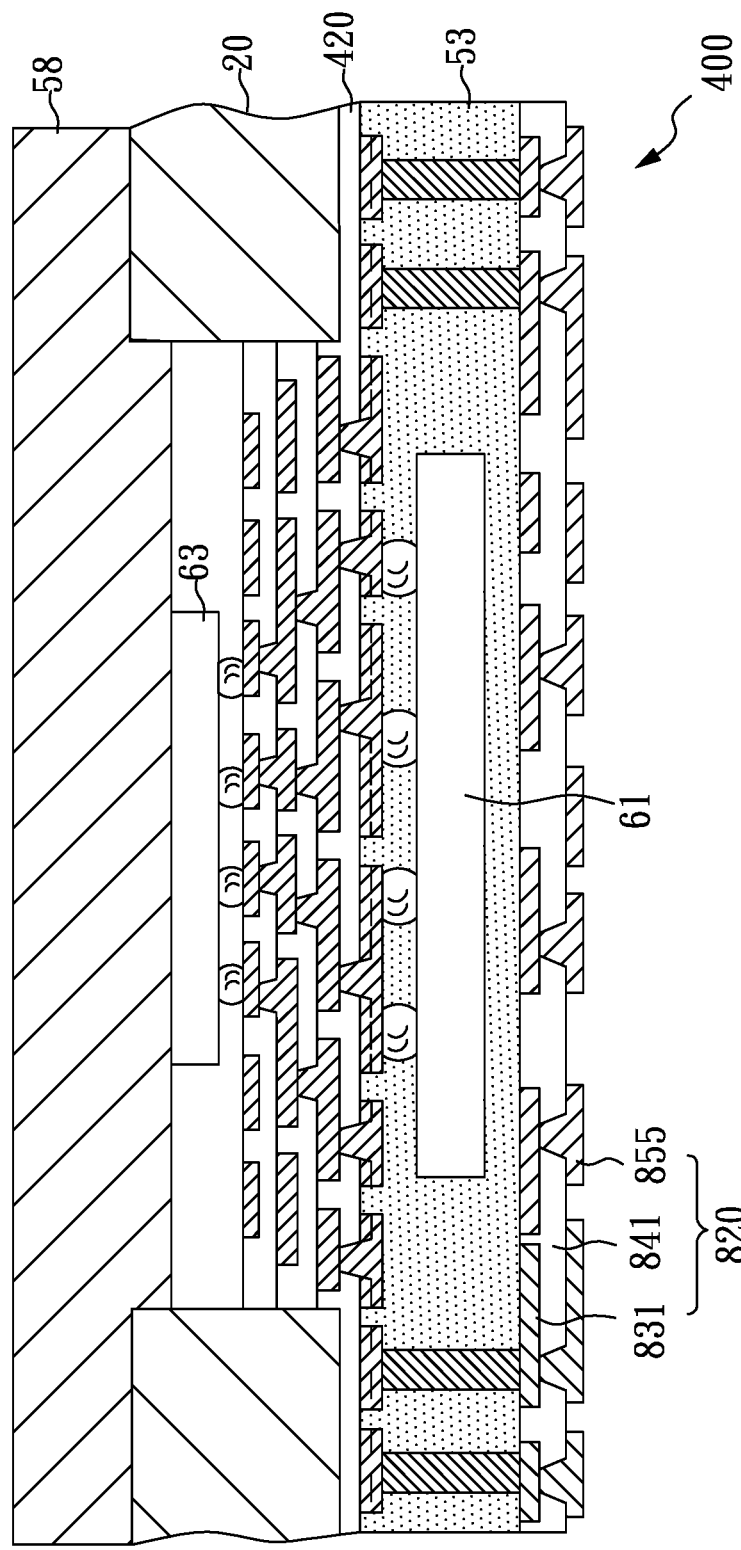
FIG. 38 is a cross-sectional view of a semiconductor assembly with a first semiconductor device and a heat spreader mounted on the wiring board of FIG. 37 in accordance with the third embodiment of the present invention.

FIG. 38 is a cross-sectional view of a semiconductor assembly with a first semiconductor device 63 and a heat spreader 58 attached to the wiring board 400 of FIG. 37. The first semiconductor device 63 is flip-chip mounted on the first surface 101 of the first routing circuitry 120 and face-to-face electrically connected to the electronic component 61 through the combination of the first routing circuitry 120 and the second routing circuitry 420. The heat spreader 58 is attached on an inactive surface of the first semiconductor device 63 and laterally extends over the first stiffener 20.

Embodiment 4

Figure 39:
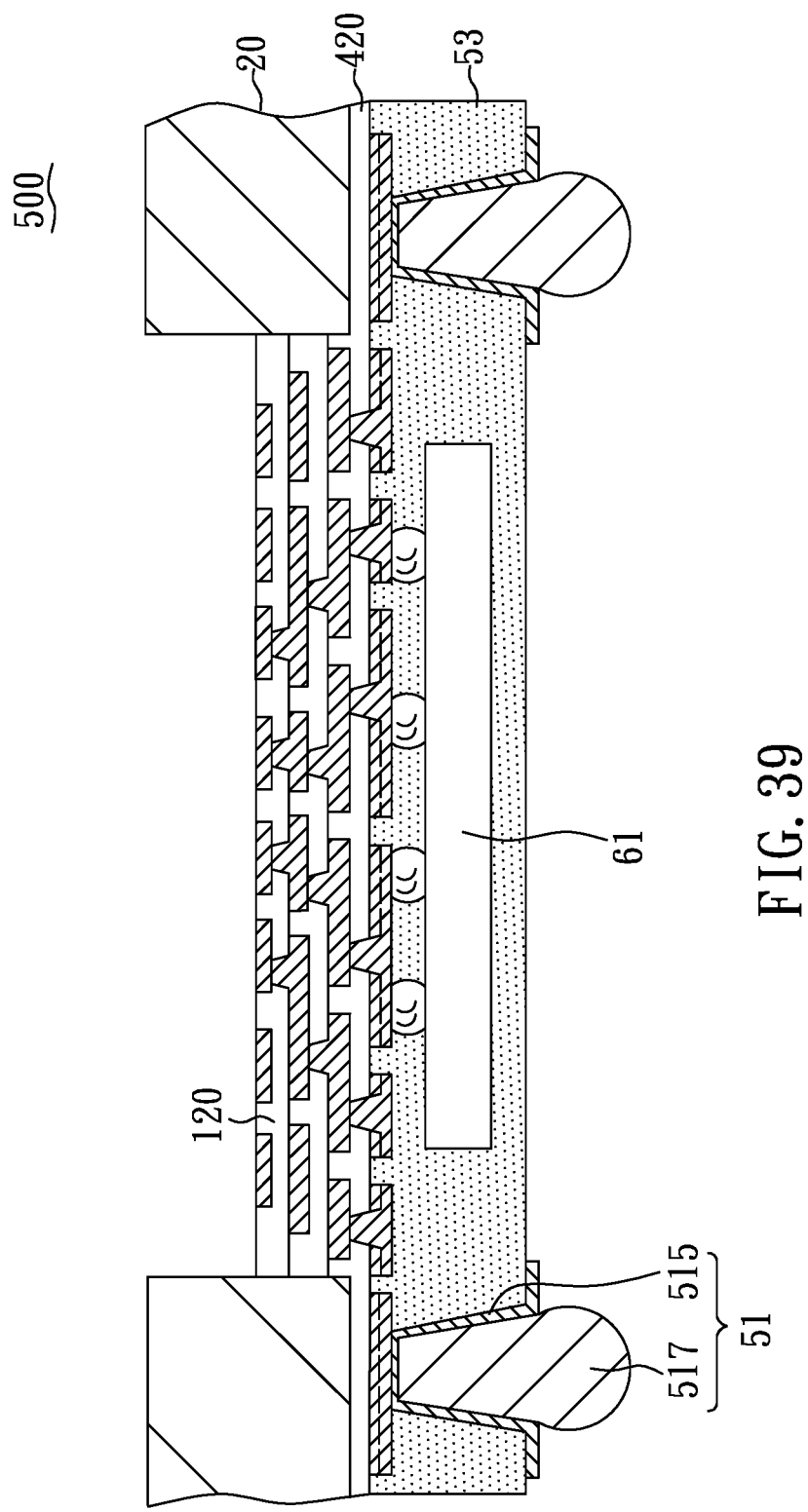
FIG. 39 is a cross-sectional view of another wiring board in accordance with the fourth embodiment of the present invention.

FIG. 39 is a cross-sectional view of another wiring board with conductive vias 515 in the second stiffener 53 and solder balls 517 in contact with the conductive vias 515 in accordance with the fourth embodiment of the present invention.

In this embodiment, the wiring board 500 is manufactured in a manner similar to that illustrated in Embodiment 2, except that the vertical connecting channels 51 include a combination of conductive vias 515 and solder balls 517.

Embodiment 5

Figure 40:
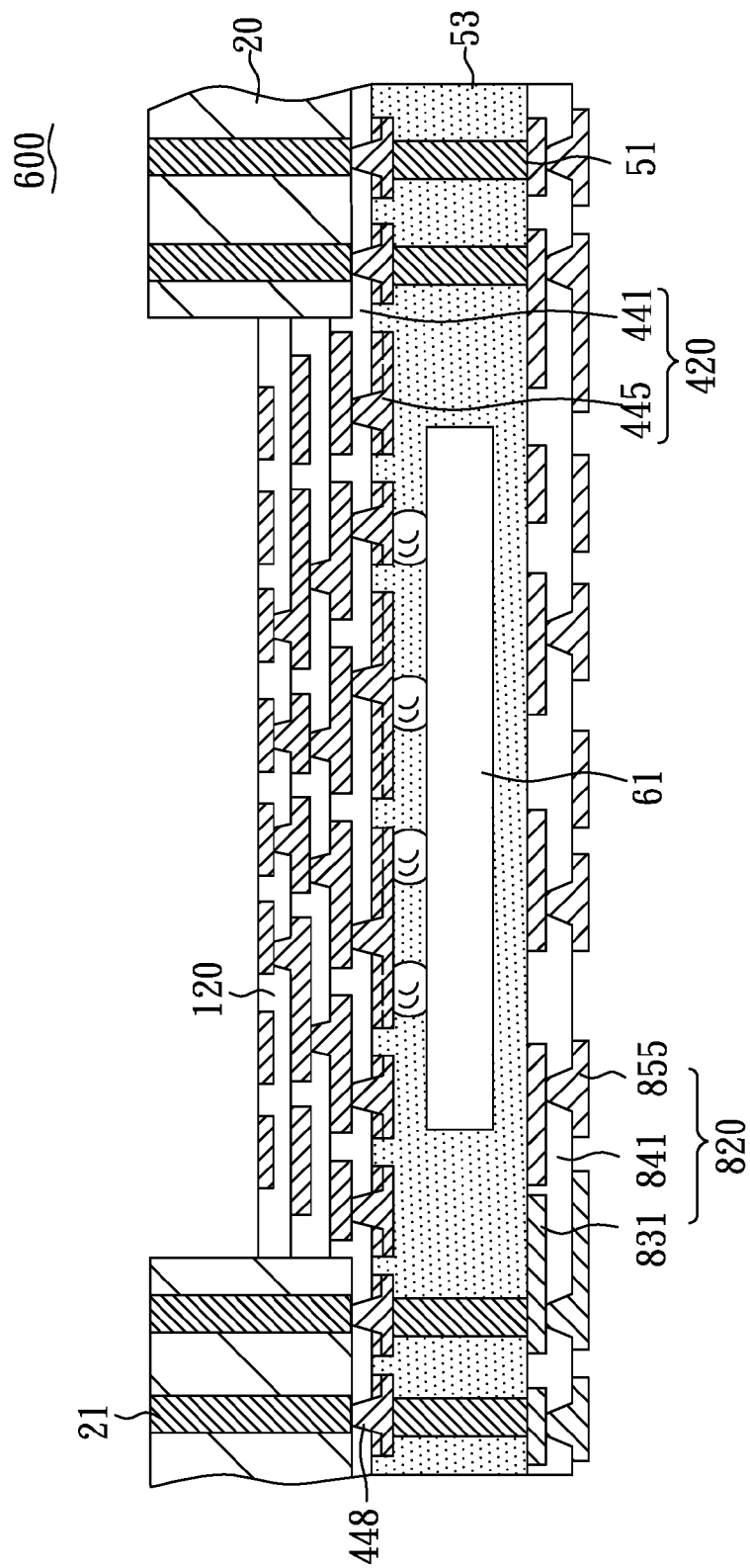
FIG. 40 is a cross-sectional view of yet another wiring board in accordance with the fifth embodiment of the present invention.

FIG. 40 is a cross-sectional view of yet another wiring board with additional vertical connecting channels in the first stiffener in accordance with the fifth embodiment of the present invention.

In this embodiment, the wiring board 600 is manufactured in a manner similar to that illustrated in Embodiment 3, except that additional vertical connecting channels 21 are formed in the first stiffener 20 and electrically coupled to the second routing circuitry 420 through additional third metallized vias 448 in the third dielectric layer 441. In this illustration, the additional vertical connecting channels 21 in the first stiffener 20 are illustrated as metal pillars. However, like the vertical connecting channels 51 in the second stiffener 53, the vertical connecting channels 21 in the first stiffener 20 may be solder balls, conductive vias or a combination thereof.

Figure 41:
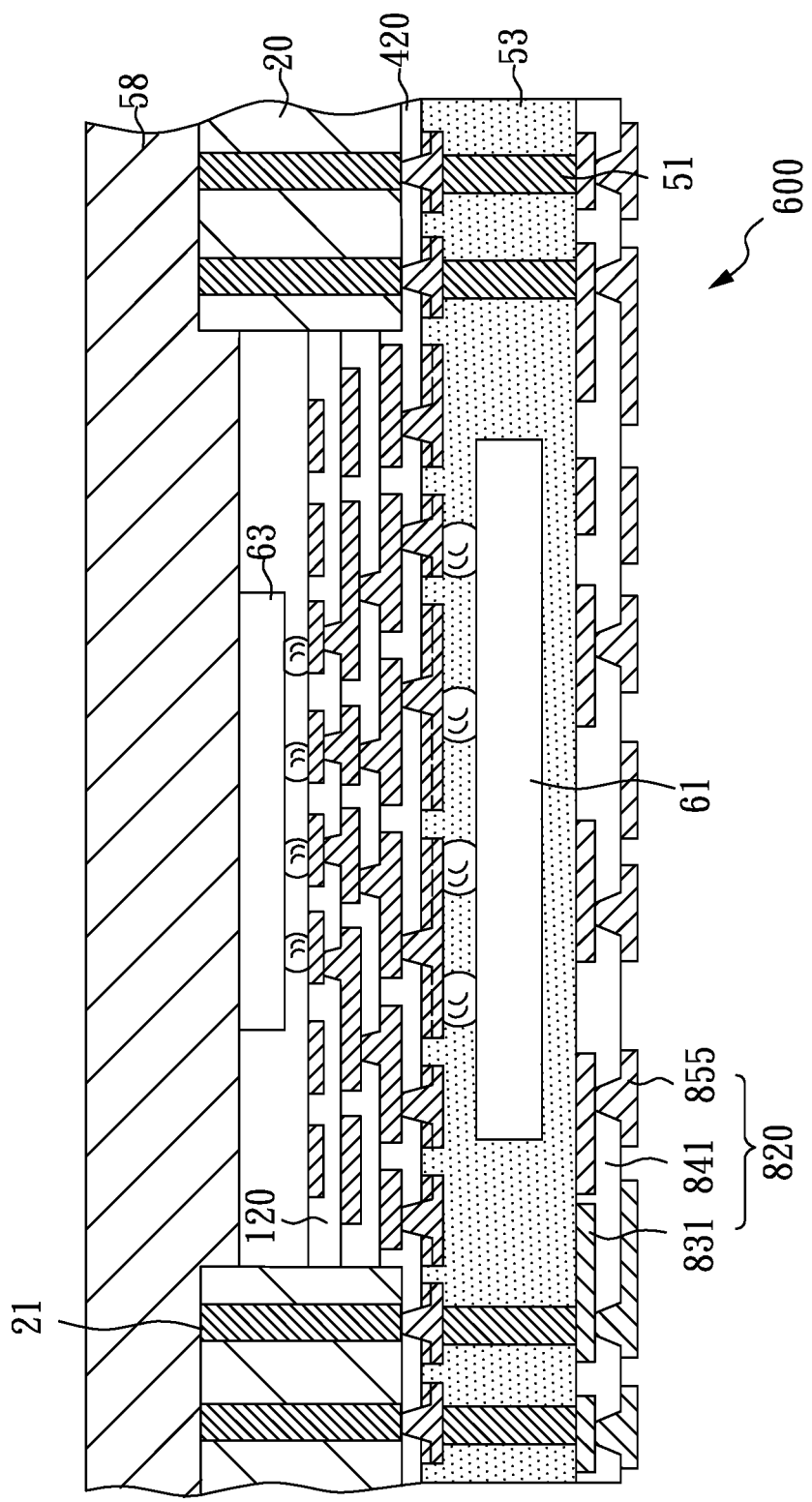
FIG. 41 is a cross-sectional view a semiconductor assembly with a semiconductor device and a heat spreader mounted on the wiring board of FIG. 40 in accordance with the fifth embodiment of the present invention.

FIG. 41 is a cross-sectional view of the structure with a first semiconductor device 63 and a heat spreader 58 attached to the wiring board 600 of FIG. 40. The first semiconductor device 63 is flip-chip mounted on the first surface 101 of the first routing circuitry 120. The heat spreader 58 is thermally conductible to the first semiconductor device 63 and electrically coupled to the vertical connecting channels 21 in the first stiffener 20 for grounding.

Figure 42:
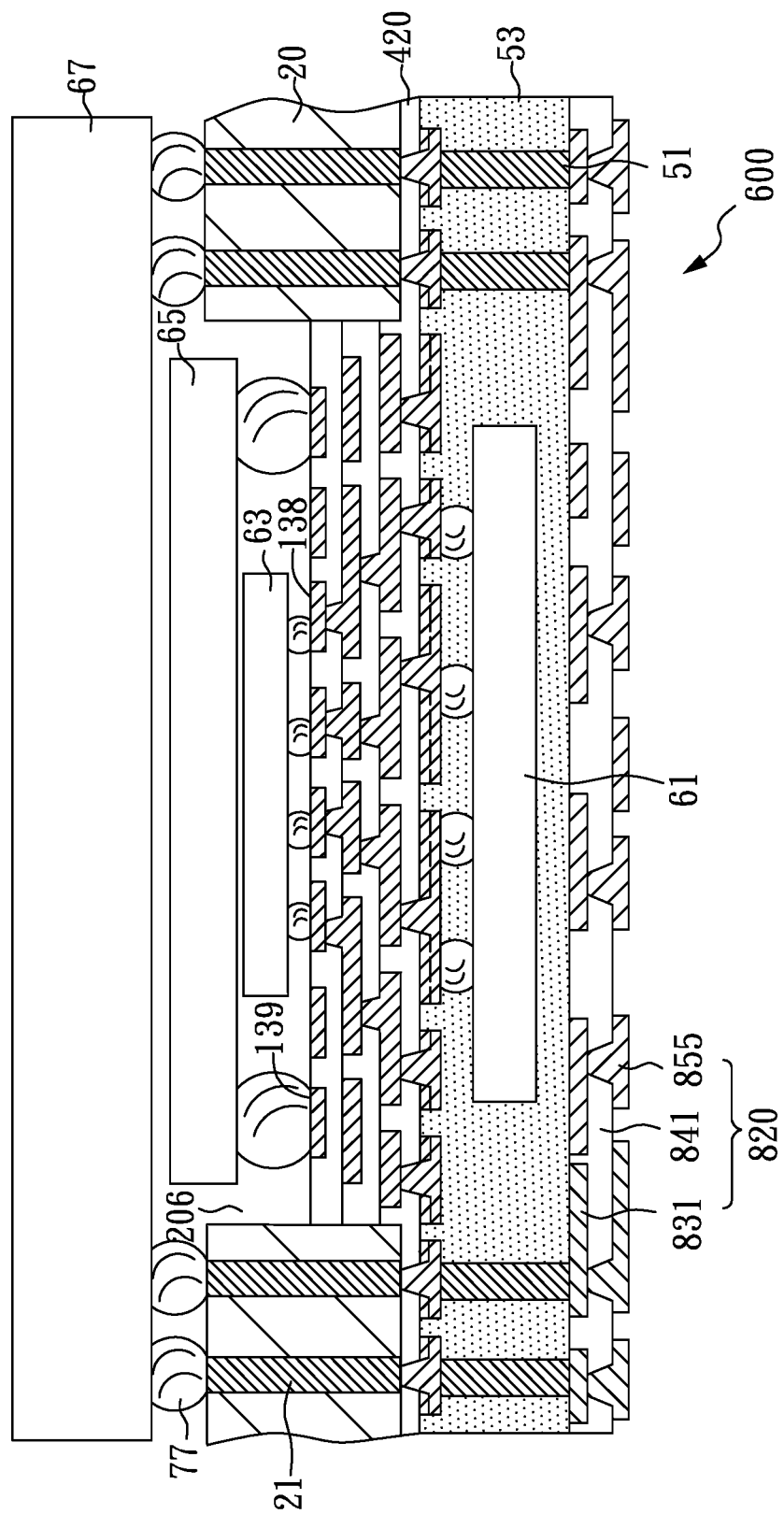
FIG. 42 is a cross-sectional view of a package-on-package assembly with multiple semiconductor devices electrically coupled to the wiring board of FIG. 40 in accordance with the fifth embodiment of the present invention.

FIG. 42 is a cross-sectional view of the structure with a first semiconductor device 63, a second semiconductor device 65 and a third semiconductor device 67 attached to the wiring board 600 of FIG. 40. The first semiconductor device 63 is disposed within the cavity 206 of the wiring board 600 and electrically coupled to the bond pads 138 of the first routing circuitry 120. The second semiconductor device 65 is disposed over the first semiconductor device 63 and electrically coupled to the stacking pads 139 of the first routing circuitry 120. The third semiconductor device 67 is disposed over the second semiconductor device 65 and the second stiffener 53 and electrically coupled to the vertically connecting channels 51.

The wiring board and assemblies described above are merely exemplary. Numerous other embodiments are contemplated. In addition, the embodiments described above can be mixed-and-matched with one another and with other embodiments depending on design and reliability considerations. For instance, the first stiffener may include multiple through openings arranged in an array and each through opening accommodates a first routing circuitry therein. Also, the second routing circuitry can include additional conductive traces to receive and route additional contact pads of additional first routing circuitries. Likewise, the second stiffener may include multiple apertures arranged in an array and each aperture accommodates an electronic component therein.

As illustrated in the aforementioned embodiments, a distinctive wiring board is configured to exhibit improved reliability, which includes a first stiffener, a first routing circuitry, a second routing circuitry, an array of vertical connecting channels, a second stiffener, an optional electronic component, and an optional third routing circuitry. For the convenience of below description, the direction in which the first surface of the first routing circuitry faces is defined as the first direction, and the direction in which the second surface of the first routing circuitry faces is defined as the second direction. The second routing circuitry is disposed over the second surface of the first routing circuitry and has a third surface facing in the second direction.

The first stiffener has a through opening and may be a single or multi-layer structure optionally with embedded single-level conductive traces or multi-level conductive traces. In a preferred embodiment, the first stiffener surrounds peripheral edges of the first routing circuitry and laterally extends to the peripheral edges of the wiring board. The first stiffener can be made of any material which has enough mechanical robustness, such as metal, composites of metal, ceramic, resin or other non-metallic materials. Accordingly, the first stiffener located around peripheral edges of the first routing circuitry can provide mechanical support for the wiring board to suppress warping and bending of the wiring board. Furthermore, additional vertical connecting channels may be formed in the first stiffener to provide electrical contacts for a semiconductor device mounted on the first stiffener from the first direction. The additional vertical connecting channels in the first stiffener can include, but not limited to, metal pillars, solder balls, conductive vias or a combination thereof.

The first and second routing circuitries can be buildup routing circuitries without a core layer and positioned within and beyond the through opening of the first stiffener, respectively. The second routing circuitry laterally extends beyond the peripheral edges of the first routing circuitry, and can have a larger surface area than that of the first routing circuitry. Preferably, the second routing circuitry extends to peripheral edges of the wiring board and substantially has a combined surface area of the first routing circuitry and the first stiffener. The first and second routing circuitries each can include at least one dielectric layer and conductive traces that fill up via openings in the dielectric layer and extend laterally on the dielectric layer. The dielectric layer and the conductive traces are serially formed in an alternate fashion and can be in repetition when needed.

The first routing circuitry can be formed on a detachable sacrificial carrier to form a subcomponent, followed by inserting the subcomponent into the through opening of the first stiffener, preferably with peripheral edges of the first routing circuitry and the sacrificial carrier in close proximity to the interior sidewall surface of the through opening of the first stiffener. Specifically, the first routing circuitry can be formed to include routing traces on the sacrificial carrier, a dielectric layer on the routing traces and the sacrificial carrier, and conductive traces that extend from selected portions of the routing traces and fill up via openings in the dielectric layer to form metallized vias and laterally extend on the dielectric layer. Further, the first routing circuitry may include additional dielectric layers, additional via openings, and additional conductive traces if needed for further signal routing. Also, the first routing circuitry may optionally include one or more passive components embedded therein. In the present invention, the step of forming the first routing circuitry on the sacrificial carrier can be executed by directly forming the first routing circuitry on the sacrificial carrier, or by separately forming and then detachably adhering the first routing circuitry to the sacrificial carrier. For the first routing circuitry, the routing traces can includes bond pads that match chip I/O pads, whereas the outmost conductive traces away from the sacrificial carrier can include contact pads with a pitch larger than that of the bond pads. Optionally, the routing traces may further include stacking pads to provide electrical contacts for another semiconductor device such as a plastic package or another semiconductor assembly. As a result, the first routing circuitry can be a multi-layered routing circuitry, and have bond pads and optional stacking pads at its first surface and contact pads at its second surface that can be electrically coupled to the bond pads and optionally to the stacking pads by metallized vias. Accordingly, in a preferred embodiment, the first routing circuitry has a pattern of traces that fan out from a finer pitch at the bonds pads to a coarser pitch at the contact pads, and provides first level fan-out routing/interconnection for a semiconductor device to be assembled thereon. The surfaces, facing in the first direction, of the bond pads, the optional stacking pads and the innermost dielectric layer adjacent to the sacrificial carrier can be substantially coplanar with each other, whereas the surface, facing in the second direction, of the outmost conductive traces away from the sacrificial carrier preferably is substantially coplanar with a surface of the first stiffener. Further, the first stiffener can extend beyond the first surface of the first routing circuitry in the first direction so as to form a cavity in the through opening of the first stiffener after removing the sacrificial carrier to expose the first surface of the first routing circuitry. Accordingly, a semiconductor device can be positioned within the cavity and electrically coupled to the bond pads exposed from the cavity. Optionally, an adhesive may be dispensed in a gap located in the through opening between the subcomponent and the first stiffener after the subcomponent is inserted into the through opening of the first stiffener, thereby providing secure robust mechanical bonds between the first routing circuitry and the first stiffener. Alternatively, the gap between the subcomponent and the first stiffener may be filled with a dielectric material squeezed out from a dielectric layer of the second routing circuitry. Accordingly, the interior sidewall surface of the through opening and the peripheral edges of the first routing circuitry and the sacrificial carrier can be coated with the adhesive or the dielectric material.

The second routing circuitry can be formed on the second surface of the first routing circuitry and laterally extend over a surface of the first stiffener to provide further fan-out routing/interconnection for the first routing circuitry after the insertion of the first routing circuitry into the through opening of the first stiffener. As the second routing circuitry can be electrically coupled to the first routing circuitry through metallized vias of the second routing circuitry, the electrical connection between the first routing circuitry and the second routing circuitry can be devoid of soldering material. Also, the interface between the first stiffener and the second routing circuitry can be devoid of solder or adhesive. More specifically, the second routing circuitry can be formed to include a dielectric layer on the first routing circuitry and the first stiffener, and conductive traces that extend from the contact pads of the first routing circuitry and optionally from the first stiffener or the additional vertical channels in the first stiffener, and fill up via openings in the dielectric layer of the second routing circuitry and laterally extend on the dielectric layer of the second routing circuitry. As a result, the second routing circuitry can contact and be electrically coupled to the contact pads of the first routing circuitry for signal routing, and optionally electrically coupled to the first stiffener for ground connection or optionally further electrically coupled to the optional vertical connecting channels in the first stiffener for signal routing or grounding. Further, the second routing circuitry may include additional dielectric layers, additional via openings, and additional conductive traces if needed for further signal routing.

Before the formation of the second routing circuitry, a carrier film (typically an adhesive tape) may be used to provide temporary retention force. For instance, the carrier film can temporally adhere to the sacrificial carrier and the first stiffener to retain the subcomponent within the through opening of the first stiffener, optionally followed by dispensing an adhesive in a gap between the first stiffener and the first routing circuitry and between the first stiffener and the sacrificial carrier, as mentioned above. After the second routing circuitry is formed on the first routing circuitry and the first stiffener, the carrier film can be detached therefrom.

As an alternative, the subcomponent and the first stiffener may be directly positioned on an dielectric layer, with the outmost conductive traces of the first routing circuitry and the first stiffener in contact with the dielectric layer, followed by bonding the dielectric layer to the first routing circuitry and the first stiffener, preferably with the dielectric layer flowed into the gap between the first routing circuitry and the first stiffener and between the sacrificial carrier and the first stiffener. As a result, the dielectric material squeezed out from the dielectric layer can provide secure robust mechanical bonds between the subcomponent and the first stiffener and retain the subcomponent within the through opening of the first stiffener. Subsequently, the second routing circuitry, including the dielectric layer bonded to the first routing circuitry and the first stiffener, can be formed to electrically couple the first routing circuitry.

The sacrificial carrier, which provides rigidity support for the first routing circuitry, can be detached from the first routing circuitry by a chemical etching process or a mechanical peeling process after the formation of the second stiffener. The sacrificial carrier can have a thickness of 0.1 mm to 2.0 mm and may be made of any conductive or non-conductive material, such as copper, nickel, chromium, tin, iron, stainless steel, silicon, glass, graphite, plastic film, or other metal or non-metallic materials. For the aspect of detaching the sacrificial carrier by a chemical etching process, the sacrificial carrier typically is made of chemically removable materials. In consideration of the bond pads in contact with the sacrificial carrier not being etched during removal of the sacrificial carrier, the sacrificial carrier may be made of nickel, chromium, tin, iron, stainless steel, or any other material that can be removed using an etching solution inactive to the bond pads as well as the optional stacking pads made of copper. Alternatively, the bond pads as well as the optional stacking pads are made of any stable material against etching during removal of the sacrificial carrier. For instance, the bond pads as well as the optional stacking pads may be gold pads in the case of the sacrificial carrier being made of copper. Additionally, the sacrificial carrier also can be a multi-layer structure having a barrier layer and a support sheet, and the first routing circuitry is formed on the barrier layer of the sacrificial carrier. As the first routing circuitry is spaced from the support sheet by a barrier layer disposed therebetween, the support sheet can be removed without damage on the routing traces of the first routing circuitry even the routing traces and the support sheet are made of the same material. The barrier layer may be a metal layer that is inactive against chemical etching during chemically removing the support sheet and can be removed using an etching solution inactive to the routing traces. For instance, the support sheet made of copper or aluminum may be provided with a nickel, chromium or titanium layer as the barrier layer on its surface, and the routing traces made of copper or aluminum are deposited on the nickel, chromium or titanium layer. Accordingly, the nickel, chromium or titanium layer can protect the routing traces from etching during removal of the support sheet. As an alternative, the barrier layer may be a dielectric layer that can be removed by, for example, a mechanical peeling or plasma ashing process. For instance, a release layer may be used as a barrier layer disposed between the support sheet and the first routing circuitry, and the support sheet can be removed together with the release layer by a mechanical peeling process.

The second stiffener typically is a resin molded stiffener and may have an aperture to accommodate the optional electronic component. As an alternative, the second stiffener may be provided to encapsulate the electronic component after electrically coupling the electronic component to the second routing circuitry. In a preferred embodiment, the second stiffener laterally extends to the peripheral edges of the wiring board. As such, the second stiffener can provide mechanical support for the wiring board from the second direction. By the dual support from the first stiffener and the second stiffener at two opposite sides of the integrated dual routing circuitries, warping and bending of the wiring board can be effectively suppressed. Also, the interface between the second stiffener and the second routing circuitry can be devoid of solder or adhesive.

The vertical connecting channels in the second stiffener can provide electrical contacts for next-level assembly or next routing circuitry connection. In a preferred embodiment, the vertical connecting channels are placed at peripheral are of the third surface of the second routing circuitry before provision of the second stiffener. The vertical connecting channels in the second stiffener can include metal pillars, solder balls, conductive vias or a combination thereof, and has a thickness different from or the same as the thickness of the second stiffener. For instance, the surface, facing in the second direction, of the vertical connecting channels may be substantially coplanar with the exterior surface of the second stiffener in the second direction. Alternatively, the thickness of the second stiffener may be larger than or smaller than the height of the vertical connecting channels. In the aspect of the second stiffener having larger thickness, the second stiffener includes a via formed therein and extending from the exterior surface of the second stiffener to the vertical connecting channels so as to expose a selected portion of the vertical connecting channels in the second direction. As for the alternative aspect of the second stiffener having smaller thickness, the vertical connecting channels extend beyond the exterior surface of the second stiffener in the second direction and have a selected portion projecting from the exterior surface of the second stiffener and uncovered by the second stiffener. In any case, the vertical connecting channels are exposed from the exterior surface of the second stiffener to provide electrical contacts for next level connection.

The optional electronic component can be flip mounted on the second routing circuitry using bumps on the third surface of the second routing circuitry and is electrically coupled to the second routing circuitry. The electronic component may be a semiconductor device, such as a packaged or unpackaged chip. For instance, the electronic component can be a bare chip, or a wafer level packaged die, etc. Alternatively, the electronic component can be a stacked-die chip.

The optional third routing circuitry is formed over the exterior surface of the second stiffener and electrically coupled to the vertical connecting channels. More specifically, the third routing circuitry can include conductive traces electrically connected to the vertical connecting channels in the second stiffener and laterally extending over the second stiffener. Further, the third routing circuitry may include one or more dielectric layers, via openings in the dielectric layer, and additional conductive traces if needed for further signal routing. The outmost conductive traces of the third routing circuitry can accommodate conductive joints, such as solder balls, for electrical communication and mechanical attachment with for the next level assembly or another electronic device.

The present invention also provides a semiconductor assembly in which a first semiconductor device is electrically coupled to the bond pads of the aforementioned wiring board. Specifically, the first semiconductor device can be positioned in the cavity of the wiring board and electrically connected to the wiring board using various using a wide variety of connection media such as bumps on the bond pads of the wiring board. Accordingly, in the aspect of the wiring board having the electronic component encapsulated by the second stiffener, the first semiconductor device can be electrically connected to the electronic component through the first and second routing circuitries therebetween, resulting in a face-to-face assembly. In the face-to-face assembly, the combination of the first and second routing circuitries can offer the shortest interconnection distance between the first semiconductor device and electronic component. The first semiconductor device can be a packaged or unpackaged chip. For instance, the first semiconductor device can be a bare chip, or a wafer level packaged die, etc. Alternatively, the first semiconductor device can be a stacked-die chip.

Additionally, a second semiconductor device may be further provided and electrically coupled to the stacking pads of the wiring board using conductive joints such as solder balls. Accordingly, the present invention can provide a package-on-package assembly that includes a first semiconductor device positioned in the cavity of the wiring board and electrically coupled to the bond pads of the wiring board, and a second semiconductor device positioned above the first semiconductor device and electrically coupled to the stacking pads of the wiring board. In a preferred embodiment, the first semiconductor device is flip mounted on the bond pads, and the second semiconductor device is positioned above the first stiffener as well as the first semiconductor device and mounted on the stacking pads. Optionally, a filler material can be further provided to fill the gap between the first semiconductor device and the first routing circuitry of the wiring board.

The term "cover" refers to incomplete or complete coverage in a vertical and/or lateral direction. For instance, in the cavity-up position, the optional third routing circuitry covers the second routing circuitry in the downward direction regardless of whether another element such as the second stiffener is between the third routing circuitry and the second routing circuitry.

The phrases "mounted on" and "attached on" include contact and non-contact with a single or multiple element(s). For instance, the optional heat spreader can be attached on the first stiffener regardless of whether it contacts the first stiffener or is separated from the first stiffener by an adhesive or solder balls.

The phrase "aligned with" refers to relative position between elements regardless of whether elements are spaced from or adjacent to one another or one element is inserted into and extends into the other element. For instance, the interior sidewall surface of the first stiffener is laterally aligned with the peripheral edges of the first routing circuitry since an imaginary horizontal line intersects the interior sidewall surface of the first stiffener and the peripheral edges of the first routing circuitry, regardless of whether another element is between the interior sidewall surface of the first stiffener and the peripheral edges of the first routing circuitry and is intersected by the line, and regardless of whether another imaginary horizontal line intersects the peripheral edges of the first routing circuitry but not the interior sidewall surface of the first stiffener or intersects the interior sidewall surface of the first stiffener but not the peripheral edges of the first routing circuitry.

The phrase "in close proximity to" refers to a gap between elements not being wider than the maximum acceptable limit. As known in the art, when the gap between the interior sidewall surface of the first stiffener and the subcomponent is not narrow enough, the location error of the subcomponent due to the lateral displacement of the subcomponent within the gap may exceed the maximum acceptable error limit. In some cases, once the location error of the subcomponent goes beyond the maximum limit, it is impossible to align the predetermined portion of the first routing circuitry with a laser beam, resulting in the electrical connection failure between the first routing circuitry and the second routing circuitry. According to the contact pad size of the first routing circuitry, those skilled in the art can ascertain the maximum acceptable limit for a gap between the first routing circuitry and the first stiffener through trial and error to ensure the metallized vias being of the second routing circuitry aligned with the contact pads of the first routing circuitry. Thereby, the description "peripheral edges of the first routing circuitry and the sacrificial carrier are in close proximity to the interior sidewall surface of the through opening of the first stiffener" means that the gap between the peripheral edges of the sacrificial carrier and the interior sidewall surface of the through opening and between the peripheral edges of the first routing circuitry and the interior sidewall surface of the through opening is narrow enough to prevent the location error of the subcomponent from exceeding the maximum acceptable error limit. For instance, the gaps in between the peripheral edges of the subcomponent and the interior sidewall surface of the through opening preferably may be in a range of about 10 to 50 microns.

The phrases "electrical connection", "electrically connected" and "electrically coupled" refer to direct and indirect electrical connection. For instance, the first conductive traces directly contact and are electrically connected to the routing traces and the second conductive traces are spaced from and electrically connected to the routing traces by the first conductive traces.

The "first direction" and "second direction" do not depend on the orientation of the wiring board, as will be readily apparent to those skilled in the art. For instance, the first surface of the first routing circuitry faces the first direction and the second surface of the first routing circuitry faces the second direction regardless of whether the wiring board is inverted. Thus, the first and second directions are opposite one another and orthogonal to the lateral directions. Furthermore, the first direction is the upward direction and the second direction is the downward direction in the cavity-up position, and the first direction is the downward direction and the second direction is the upward direction in the cavity-down position.

The wiring board according to the present invention has numerous advantages. For instance, the first and second stiffeners can provide anti-warping platforms for the integrated dual routing circuitries to suppress warping and bending of the wiring board. The vertical connecting channels in the second stiffener can offer electrical contacts for next-level connection. The first routing circuitry within the through opening of the first stiffener provides a first level fan-out routing/interconnection for a semiconductor device to be assembled thereon, whereas the second routing circuitry on the first routing circuitry and the first stiffener provides a second level fan-out routing/interconnection. As such, a semiconductor device with fine pads can be electrically coupled to one side of the first routing circuitry with pad pitch that matches the semiconductor device, and the second routing circuitry is electrically coupled to the other side of the first routing circuitry with larger pad pitch and further enlarges the pad size and pitch of the semiconductor device. The wiring board made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A method of making a wiring board with dual stiffeners and dual routing circuitries integrated together, comprising:
   forming a first routing circuitry directly on a detachable sacrificial carrier, wherein the first routing circuitry has a first surface attached to the sacrificial carrier and an opposite second surface;
   providing a first stiffener that has a first surface, an opposite second surface and a through opening, wherein the through opening has an interior sidewall surface that extends through the first stiffener from the first surface to the second surface;
   inserting the first routing circuitry and the sacrificial carrier into the through opening of the first stiffener, with the first routing circuitry and the sacrificial carrier being adjacent to and surrounded by the interior sidewall surface of the first stiffener, and with the first surface of the first routing circuitry positioned at a level between the first surface and the second surface of the first stiffener;
   forming a second routing circuitry over the second surface of the first routing circuitry and the second surface of the first stiffener, wherein the second routing circuitry is electrically coupled to the first routing circuitry through metallized vias and has an exterior surface facing away from the second surface of the first routing circuitry;
   forming an array of vertical connecting channels over the exterior surface of the second routing circuitry, wherein the vertical connecting channels are electrically coupled to the second routing circuitry;
   forming a second stiffener over the exterior surface of the second routing circuitry; and
   removing the sacrificial carrier entirely from the first surface of the first routing circuitry to leave a cavity in the through opening of the first stiffener and thereby expose the first surface of the entire first routing circuitry from the cavity;
   wherein the vertical connecting channels are laterally surrounded by the second stiffener and exposed from an exterior surface of the second stiffener.

2. The method of claim 1, further comprising a step of electrically coupling an electronic component to the second routing circuitry, wherein the electronic component is disposed over the exterior surface of the second routing circuitry and laterally surrounded by the vertical connecting channels.

3. The method of claim 2, wherein the step of electrically coupling the electronic component to the second routing circuitry includes inserting the electronic component into an aperture of the second stiffener.

4. The method of claim 2, wherein the electronic component is electrically coupled to the second routing circuitry before the step of forming the second stiffener, and the step of forming the second stiffener includes encapsulating the electronic component with the second stiffener.

5. The method of claim 4, further comprising a step of forming a third routing circuitry over the exterior surface of the second stiffener, wherein the third routing circuitry is electrically coupled to the vertical connecting channels.

6. The method of claim 1, wherein the step of forming the second routing circuitry includes electrically coupling the second routing circuitry to additional vertical connecting channels in the first stiffener through additional metallized vias.

\* \* \* \* \*